(12) United States Patent
Luo et al.

(10) Patent No.: US 12,327,760 B2
(45) Date of Patent: Jun. 10, 2025

(54) INTERCONNECT STRUCTURES HAVING VARIED MATERIALS

(71) Applicant: Taiwan Semiconductor Manufacturing Company, Ltd., Hsinchu (TW)

(72) Inventors: Guanyu Luo, Hsinchu (TW); Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 160 days.

(21) Appl. No.: 17/875,953

(22) Filed: Jul. 28, 2022

(65) Prior Publication Data
US 2022/0375791 A1    Nov. 24, 2022

Related U.S. Application Data

(62) Division of application No. 16/949,953, filed on Nov. 20, 2020, now Pat. No. 11,482,451.

(51) Int. Cl.
| | |
|---|---|
| *H01L 23/52* | (2006.01) |
| *H01L 21/285* | (2006.01) |
| *H01L 21/768* | (2006.01) |
| *H01L 23/522* | (2006.01) |
| *H10D 30/01* | (2025.01) |

(Continued)

(52) U.S. Cl.
CPC .. *H01L 21/76846* (2013.01); *H01L 21/28568* (2013.01); *H01L 21/76805* (2013.01); *H01L 21/76895* (2013.01); *H01L 23/522* (2013.01); *H10D 30/024* (2025.01);

(Continued)

(58) Field of Classification Search
CPC ......... H01L 21/76846; H01L 21/28568; H01L 21/76805; H01L 21/76895; H01L 23/522; H01L 29/41791; H01L 29/45; H01L 29/66795; H01L 29/7851; H01L 29/785; H01L 23/53209; H01L 23/53266; H01L 23/485; H01L 2221/1063; H01L 21/76843; H01L 21/76844; H01L 21/76877; H01L 23/5226; H01L 23/53238; H01L 23/53252;

(Continued)

(56) References Cited

U.S. PATENT DOCUMENTS

| | | | |
|---|---|---|---|
| 2016/0204064 A1* | 7/2016 | Horak | H01L 23/528 257/529 |
| 2019/0198444 A1* | 6/2019 | Amanapu | H01L 23/53238 |
| 2021/0104524 A1* | 4/2021 | Hwang | H01L 29/0847 |

* cited by examiner

*Primary Examiner* — Shouxiang Hu
(74) *Attorney, Agent, or Firm* — HAYNES AND BOONE, LLP

(57) ABSTRACT

A semiconductor device includes a first underlying metal line and a second underlying metal line in a first dielectric layer over a substrate. The semiconductor device includes a first metal feature and a second metal feature in a second dielectric layer over the first dielectric layer. The first metal feature is over and connected to the first underlying metal line, and the second metal feature is over and connected to the second underlying metal line. The first metal feature has a first dimension, the second metal feature has a second dimension, the second dimension being greater than the first dimension. The first metal feature includes a first metal having a first mean free path, the second metal feature includes a second metal having a second mean free path, and the second mean free path is greater than the first mean free path.

20 Claims, 26 Drawing Sheets

(51) Int. Cl.
    *H10D 30/62*          (2025.01)
    *H10D 64/62*          (2025.01)

(52) U.S. Cl.
    CPC ..... *H10D 30/6211* (2025.01); *H10D 30/6219* (2025.01); *H10D 64/62* (2025.01)

(58) Field of Classification Search
    CPC ............. H10D 30/024; H10D 30/6211; H10D 30/6219; H10D 64/62; H10D 30/62
    See application file for complete search history.

INTERCONNECT STRUCTURES HAVING VARIED MATERIALS

PRIORITY

This is a divisional application of and claims priority to U.S. application Ser. No. 16/949,953, filed Nov. 20, 2020, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing of ICs and, for these advances to be realized, similar developments in IC processing and manufacturing are needed. For example, conventional conductive materials for interconnect structures, when implemented at the low dimensions of the advanced technology nodes, may present increased resistances. Such increased resistance may negate improvements in performance due to the reduced node size. Accordingly, although existing interconnect technology have been generally adequate for the intended purposes, they have not been satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
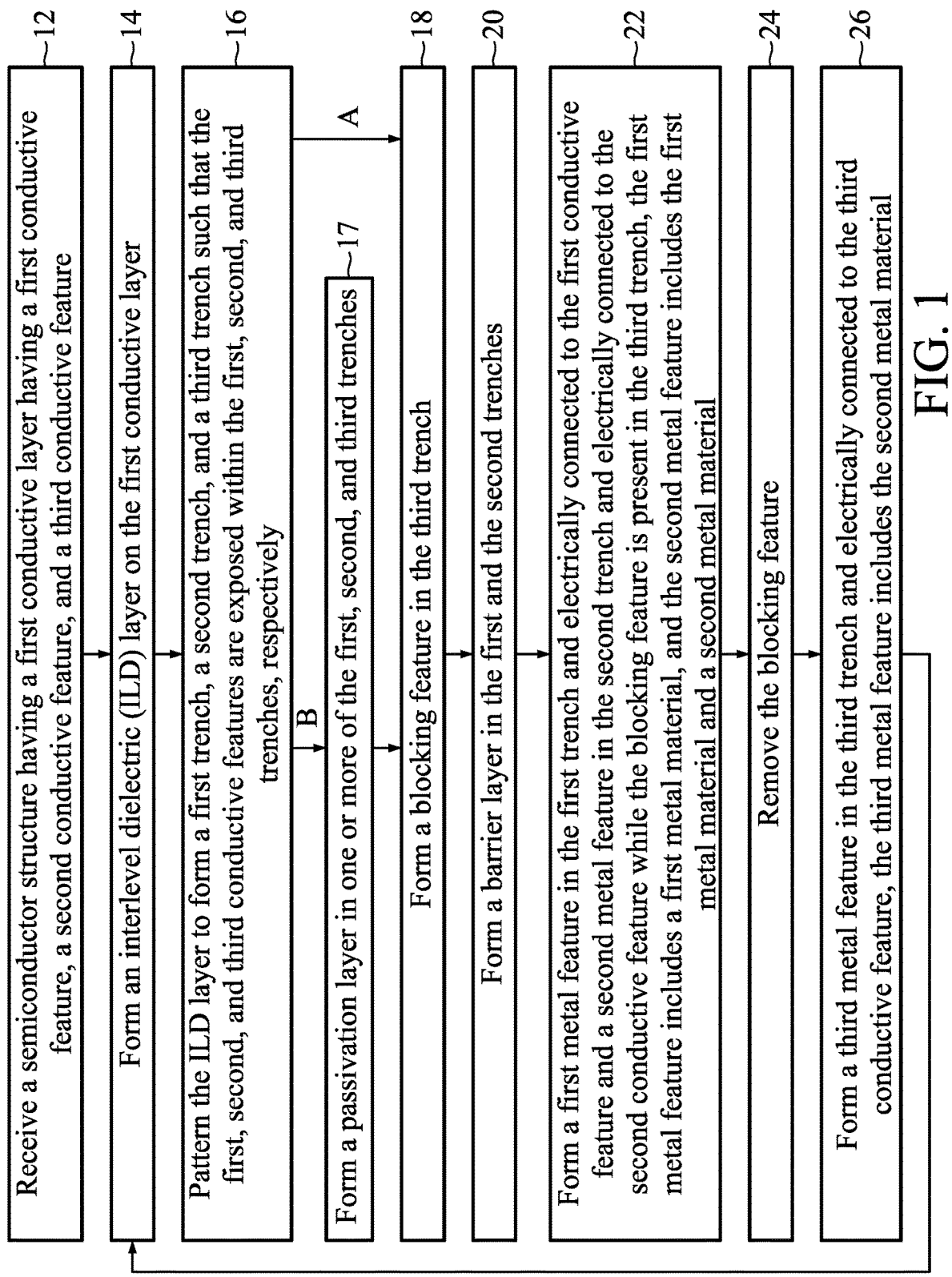
FIG. 1 is a flow chart illustrating a method of fabricating an interconnect structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm.

The present disclosure is generally related to ICs and semiconductor devices as well as methods of forming the same. As technologies progress towards smaller technology nodes (for example, 20 nm, 16 nm, 10 nm, 7 nm, 5 nm, and below), the optimization of performance of ICs and semiconductor devices is increasingly limited by resistances in and across various conductive features, such as contacts, vias, and/or metal lines. Increased resistances not only lead to unnecessary power consumptions, reduce device speeds, but also cause voltage drops along the length of the conductive features, thereby present undesirable variations in device properties in different regions. As a result, device performances may be degraded. For example, in some approaches, metals like copper (Cu) and aluminum (Al) have been widely used as the fill materials for conductive features of the interconnect structures. Although they provide optimal resistances at the larger dimensions, they present high resistances at lower dimensions often required in advanced technology nodes. Recently, alternative metal materials, such as cobalt (Co), ruthenium (Ru), iridium (Ir), tungsten (W), and molybdenum (Mo) have been introduced for use in the lower-dimension conductive features, however, these materials may be significantly more expensive than Cu and Al, and may not bring the proper resistance characteristics for the larger dimension conductive features that may coexist in the same interconnect structure. Accordingly, this present disclosure provides methods to select materials for and fabricate conductive features of the interconnect structure based on their respective dimensions.

According to principles described herein, the materials for each conductive features of the interconnect structure are assigned based on their respective dimensions as compared to a lower threshold value, T1, and a higher threshold value, T2. For example, materials particularly suitable for conductive features of high dimensions, such as copper (Cu), aluminum (Al), or combinations thereof, are assigned to conductive features having dimensions greater than the higher threshold value T2. Materials particularly suitable for conductive features having small dimensions, such as cobalt (Co), ruthenium (Ru), iridium (Ir), tungsten (W), molybdenum (Mo), or combinations thereof are assigned to conductive features having dimensions less than a lower threshold value T1; and hybrid structures including both types of materials are assigned to conductive features having dimensions between the lower threshold value T1 and the higher threshold value T2. Moreover, blocking layers may be used to enable forming of direct physical contact between conductive features of different layers, thereby further reducing resistances as necessary. Accordingly, the overall resistance of the interconnect structure is reduced as compared to approaches not implementing methods described herein. Additionally, the provided methods enable cost reductions by maximizing the use of cost-effective materials without compromising the resistance properties. Different embodiments may have different advantages, and no particular advantage is necessarily required of any embodiment.

The interconnect structures described here may be fabricated during processing of an IC, or a portion thereof, that may comprise static random access memory (SRAM) and/or logic circuits, passive components such as resistors, capacitors, and inductors, and active components such as metal-oxide semiconductor field effect transistors (MOSFETs), planar MOSFETs, p-type field effect transistors (PFETs), n-type FETs (NFETs), multi-gate FETs such as FinFETs, other multi-gate FETS, complementary metal-oxide semiconductor transistors (CMOS), bipolar transistors, high voltage transistors, high frequency transistors, other memory cells, and combinations thereof. One of ordinary skill may recognize other examples of semiconductor devices that may benefit from aspects of the present disclosure.

Figure 2A:
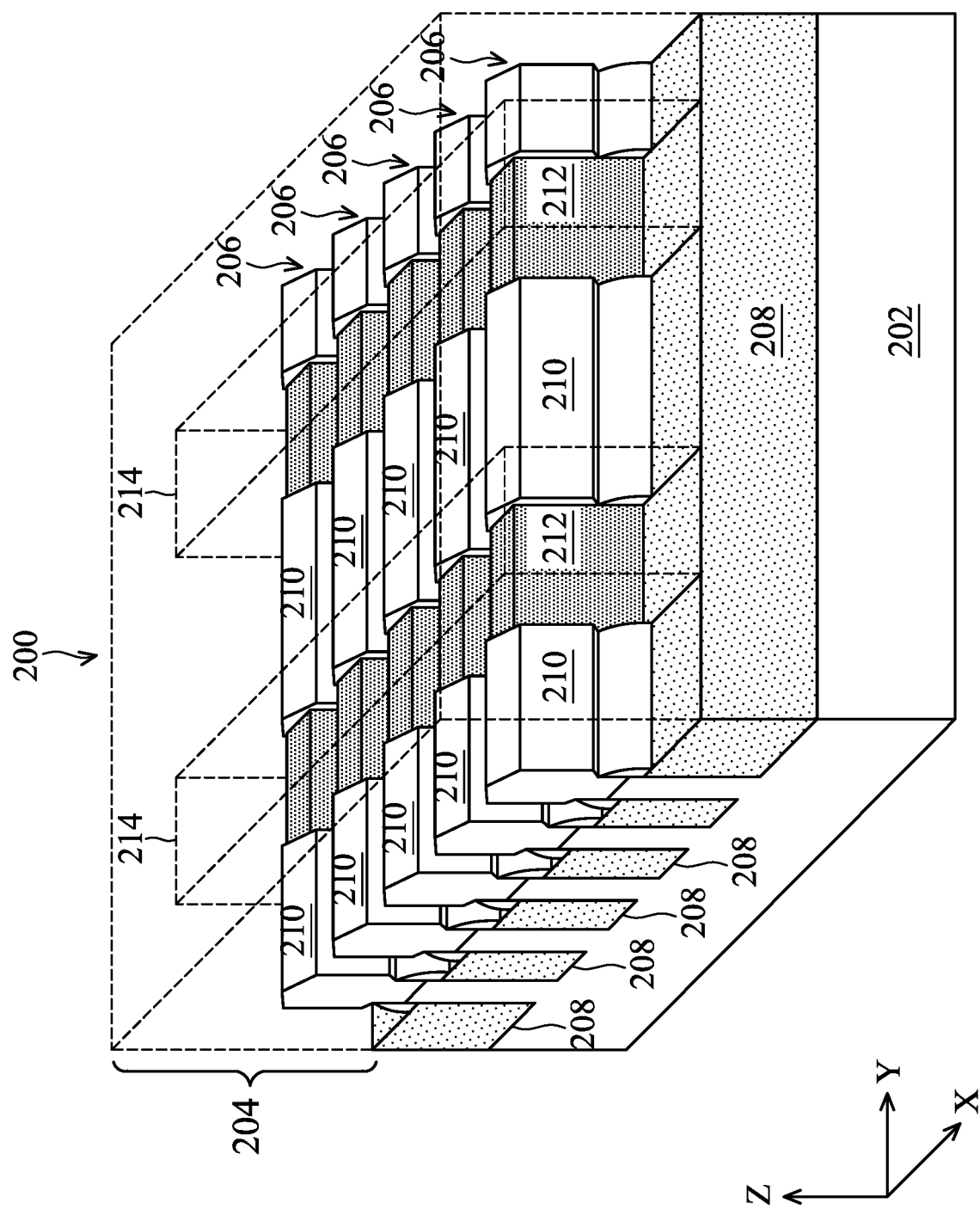
FIG. 2A is a three-dimensional (3D) perspective view of a semiconductor structure that includes or underlies an interconnect structure of the present disclosure.
Figure 2B:
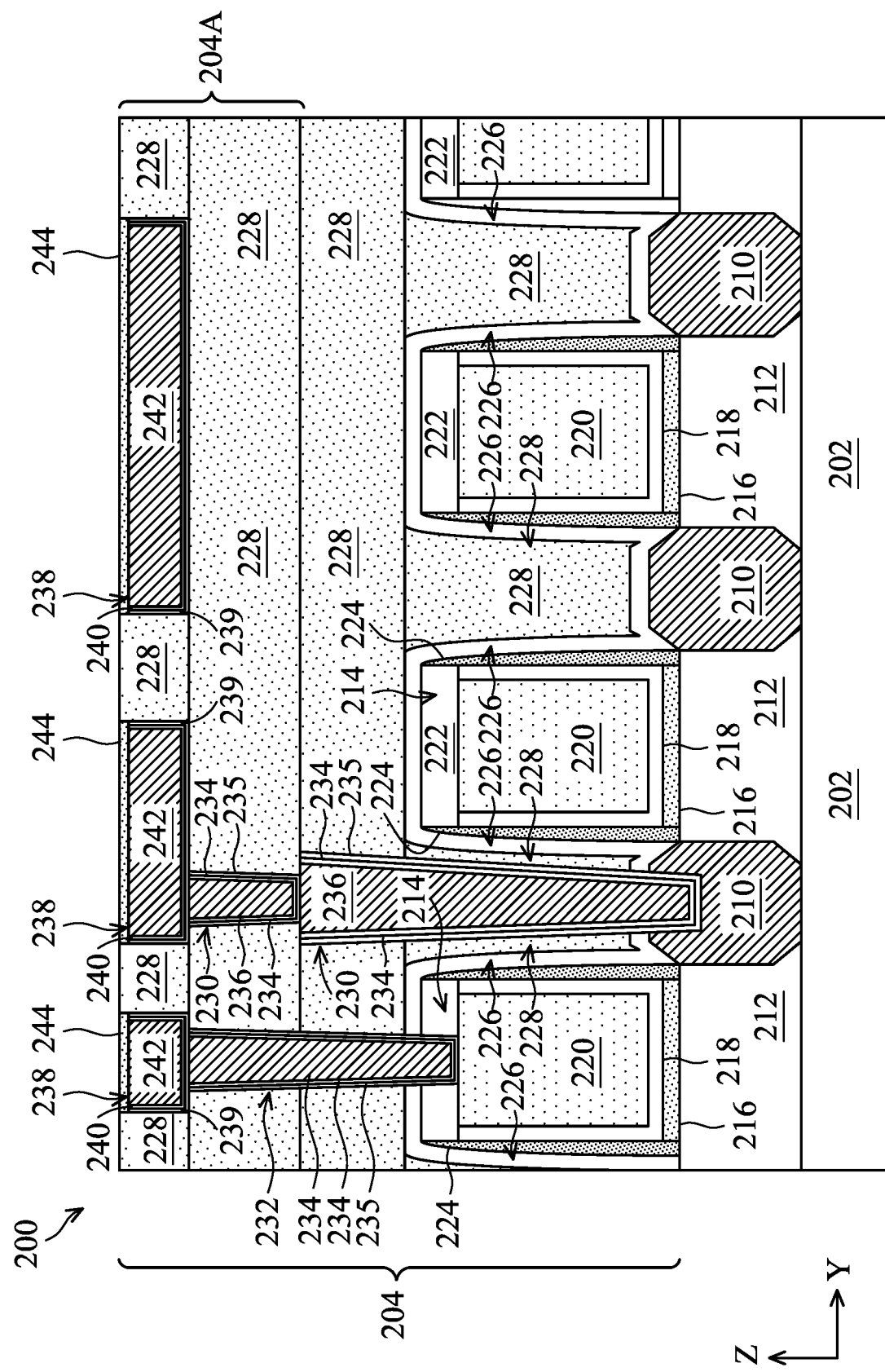
FIG. 2B is a cross-sectional side view of the semiconductor structure of FIG. 2A along a Y-Z cross section.

FIG. 1 is a flow chart illustrating an example method for fabricating an interconnect structure of the present disclosure. FIG. 2A is a three-dimensional (3D) view of a semiconductor device that includes or underlies a portion of the interconnect structure of the present disclosure. FIG. 2B is a cross-sectional side view of the semiconductor device of FIG. 2A. FIGS. 3-16, 18A-18D, and 19A-19D are cross-sectional side views of an interconnect structure of the present disclosure at various stages of fabrication according to various aspects of the present disclosure. FIG. 17 is a flow chart illustrating an example method for selecting material options for the conductive features of the interconnect structures of the present disclosure.

Referring to block 12 of FIG. 1A and to FIGS. 2A and 2B, a workpiece 200 is received that includes a substrate 202 and a portion of an interconnect structure 204 disposed over the substrate 202. The interconnect structure 204 is represented by a transparent marker in FIG. 2A to avoid obscuring the underlying structures of the substrate 202. The substrate 202 represents any structure upon which circuit devices may be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form fins. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, other suitable insulator materials, and/or combinations thereof.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

A number of circuit devices may be formed on the substrate 202 such as Fin-like Field Effect Transistors (FinFETs), planar FETs, memory devices, Bipolar-Junction Transistors (BJTs), Light-Emitting Diodes (LEDs), other active and/or passive devices. In some examples, the devices to be formed on the substrate 202 extend out of the substrate 202. For example, FinFETs and/or other non-planar devices may be formed on device fins 206 disposed on the substrate 202. The device fins 206 are representative of any raised feature and include FinFET device fins 206 as well as fins 206 for forming other raised active and passive devices upon the substrate 202. The fins 206 may be similar in composition to the substrate 202 or may be different therefrom. For example, in some embodiments, the substrate 202 may include primarily silicon, while the fins 206 include one or more layers that are primarily germanium or a SiGe semiconductor. In some embodiments, the substrate 202 includes a SiGe semiconductor, and the fins 206 include a SiGe semiconductor with a different ratio of silicon to germanium than the substrate 202.

The fins 206 may be formed by etching portions of the substrate 202, by depositing various layers on the substrate 202 and etching the layers, and/or by other suitable techniques. For example, the fins 206 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 206 and is patterned using a photolithography process. Spacers are formed alongside the patterned sacrificial layer using a self-aligned process. The sacrificial layer is then removed, and the remaining spacers are used to pattern the fins 206 by removing material of the substrate 202 that is not covered by the spacers so that the fins 206 remain.

The workpiece 200 may also include an isolation dielectric layer 208 disposed on the substrate 202 between the fins 206 to form isolation features (e.g., Shallow Trench Isolation features (STIs)). The isolation dielectric layer 208 may include a dielectric material such as a semiconductor oxide, a semiconductor nitride, a semiconductor oxynitride, a semiconductor carbide, a semiconductor carbonitride, a semiconductor oxycarbonitride, a metal oxide, etc. The isolation dielectric layer 208 may be formed by any suitable process, and in some examples, the isolation dielectric layer 208 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. Following deposition, the isolation dielectric layer 208 may be etched back so that the uppermost portions of the fins 206 protrude above the isolation dielectric layer 208. In various such examples, the fins 206 extend between about 100 nm and about 500 nm above the topmost surface of the isolation dielectric layer 208.

The fins 206 may include source/drain features 210 and channel regions 212 disposed between the source/drain features. The source/drain features 210 and the channel regions 212 may be doped to be of opposite type. For an n-channel device, the source/drain features 210 are doped with an n-type dopant and the channel region 212 is doped with a p-type dopant, and vice versa for an p-channel device.

One or more gate structures 214 may be disposed above and alongside the channel regions 212. The flow of carriers (electrons for an n-channel device and holes for a p-channel device) through the channel region between the source/drain features 210 is controlled by a voltage applied to the gate structures 214. To avoid obscuring other features of the workpiece 200, the gate structures 214 are represented by translucent markers in FIG. 2A.

Suitable gate structures 214 include both polysilicon and metal gates. An exemplary gate structure 214 includes an interfacial layer 216 disposed on the channel region 212 that contains an interfacial material, such as a semiconductor oxide, semiconductor nitride, semiconductor oxynitride, other semiconductor dielectric, other suitable interfacial materials, and/or combinations thereof. A gate dielectric 218 is disposed on the interfacial layer 216 and includes one or more dielectric materials such as a high-k dielectric material (e.g., $HfO_2$, HfSiO, HfSiON, HfTaO, HfTiO, HfZrO, zirconium oxide, aluminum oxide, hafnium dioxide-alumina ($HfO_2$—$Al_2O_3$) alloy, etc.), semiconductor oxide, semiconductor nitride, semiconductor oxynitride, semiconductor carbide, amorphous carbon, tetraethylorthosilicate (TEOS), other suitable dielectric material, and/or combinations thereof.

A gate electrode 220 is disposed on the gate dielectric 218 and includes layers of conductive materials. An exemplary gate electrode 220 includes a capping layer, one or more work function layers disposed on the capping layer, and an electrode fill disposed on the work function layer(s).

In some examples, the gate structure 214 includes a gate cap 222 on top of the gate dielectric 218 and the gate electrode 220. The gate cap 222 may include a dielectric material (e.g., a semiconductor oxide, a semiconductor nitride, a semiconductor oxynitride, a semiconductor carbide, a semiconductor oxycarbonitride, etc.), polysilicon, Spin-On Glass (SOG), TEOS, Plasma Enhanced CVD oxide (PE-oxide), High-Aspect-Ratio-Process (HARP)-formed oxide, and/or other suitable material.

Sidewall spacers 224 are disposed on the side surfaces of the gate structures 214 and are used to offset the source/drain features 210 and to control the source/drain junction profile. In various examples, the sidewall spacers 224 include one or more layers of dielectric materials, such as a semiconductor oxide, a semiconductor nitride, a semiconductor oxynitride, a semiconductor carbide, a semiconductor oxycarbonitride, SOG, TEOS, PE-oxide, HARP-formed oxide, and/or other suitable materials.

The workpiece 200 may also include a Bottom Contact Etch-Stop Layer (BCESL) 226 disposed on the source/drain features 210, on the gate structures 214, and alongside the sidewall spacers 224. The BCESL 226 may include a dielectric (e.g., a semiconductor oxide, a semiconductor nitride, a semiconductor oxynitride, a semiconductor carbide, etc.) and/or other suitable material. In various embodiments, the BCESL 226 includes SiN, SiO, SiON, and/or SiC.

The interconnect structure 204 electrically couples the circuit features such as the source/drain features 210 and the gate structures 214. The interconnect structure 204 includes a number of conductive features interspersed between layers of an Inter-Level Dielectric (ILD layers 228). The ILD layers 228 may include any suitable dielectric material, such as a semiconductor oxide, a semiconductor nitride, a semiconductor oxynitride, a semiconductor carbide, TEOS oxide, PhosphoSilicate Glass (PSG), BoroPhosphoSilicate Glass (BPSG), Fluorinated Silica Glass (FSG), carbon doped silicon oxide, Black Diamond®, Xerogel, Aerogel, amorphous fluorinated carbon, Parylene, BCB (bis-benzocyclobutenes), SiLK® (a registered trademark of Dow Chemical, Midland, Michigan), polyimide, other suitable materials, and/or combinations thereof. The ILD layers 228 act to support and electrically isolate the conductive features.

Capacitance occurs between parallel conductors, such as conductive lines, contacts, and/or vias, that are separated by a dielectric, such as the ILD layer 228. This capacitance may slow the transmission of signals through the interconnect structure 204. To address this, the interconnect's ILD layer(s) 228 may incorporate materials with low dielectric constants (e.g., low-k dielectrics, which have a lower dielectric constant than silicon dioxide). The lower dielectric constant of these materials may reduce parasitic coupling capacitance as well as interference and noise between the conductive features.

The lowest ILD layers 228 of the interconnect structure 204 support and electrically isolate the gate structures 214 as well as contacts that couple to substrate features, such as source/drain contacts 230 and gate contacts 232 that extend to and electrically couple to the source/drain features 210 and gate structures 214, respectively. The contacts 230 and 232 may each include a contact liner 234 and a contact fill 236. The contact liner 234 may act as a seed layer when depositing the contact fill 236 and may promote adhesion of the contact fill 236 to the remainder of the workpiece 200. In some embodiments, the contacts 230 and 232 may each further include a barrier layer 235. The barrier layer 235 may prevent material of the contact from diffusing into the workpiece 200. In some embodiments, the barrier layer 235 may cause undesirable increase in resistances. Accordingly, as described later, portions of the barrier layer 235 may be removed to form direct contact between the liner layer 234 and the underlying features (such as source/drain features 210 and/or gate electrode 220). In some embodiments, the barrier layer 235 is omitted entirely. The contact liner 234 may include any suitable conductive material including metals (e.g., titanium (Ti), tantalum (Ta), cobalt (Co), tungsten (W), aluminum (Al), nickel (Ni), copper (Cu), cobalt (Co), etc.), metal nitrides, metal silicon nitrides, other suitable materials, and/or combinations thereof. In one such embodiment, the contact liner 234 includes TiN. The contact fill 236 may include any suitable material including metals (e.g., Co, W, Al, Ta, Ti, Ni, Cu, etc.), metal oxides, metal nitrides, other suitable materials, and/or combinations thereof, and in some examples, the contact fill 236 includes cobalt and/or tungsten. However, as described later, certain contact fill 236 may be more suitable than others based on their dimensions.

Subsequent ILD layers 228 of the interconnect structure 204 may contain conductive lines 238 that extend horizontally in a given layer and/or vias that extend vertically to couple conductive lines 238 in different layers. The conductive lines 238 may each include a liner 240, a fill material 242, and a line cap 244 disposed on the liner 240. The liner 240 may be substantially similar to the contact liner 234 and may include one or more metals, metal nitrides, metal silicon nitrides, other suitable materials, and/or combinations thereof. In one such embodiment, the liner 240 includes TiN. The fill material 242 may be substantially similar to the contact fill 236 and may include one or more metals, metal oxides, metal nitrides, other suitable materials, and/or combinations thereof. In one such embodiment, the fill material 242 includes cobalt and/or tungsten. In some embodiments, the conductive lines 238 may each further include a barrier layer 239. The barrier layer 239 may prevent material of the contact from diffusing into the workpiece 200. In some embodiments, the barrier layer 239 may cause undesirable increase in resistances. Accordingly, as described later, portions of the barrier layers 239 may be removed to form direct contact between the liner 240 and the underlying features (such as contacts 230).

The line cap 244 may include any suitable conductive material including metals, metal oxides, metal nitrides, and/or combinations thereof, and the material of the line cap 244 may be the same or different from the fill material 242 and/or the liner 240. In some examples, the line cap 244 includes a metal and a dopant that increases the etch selectivity of the line cap 244. The line cap 244 may have any suitable thickness, and in various examples, is between about 1 nm and about 5 nm thick.

The conductive lines 238 and vias that connect them may be formed layer-by-layer. Each layer (referred to hereinafter "interconnect layers") includes the ILD layers 228 and the conductive features (such as conductive lines 238 and/or vias) embedded within. For example, FIG. 2B illustrates one of the interconnect layers 204A. The interconnect structure 204 may include any number of such interconnect layers stacked vertically. Those additional interconnect layers may be referred to as interconnect layer 204B, interconnect layer 204C, etc., and will be described in detail below. To form a new interconnect layer, an etch stop layer may be formed on the existing ILD layer 228 and on any conductive lines 238 therein. And another ILD layer 228 is formed on top of the etch stop layer. Details of the etch stop layer are provided later.

As described above, the interconnect structure 204 may include any number of interconnect layers stacked vertically with conductive lines running horizontally within the layers, and vias extending vertically to connect conductive lines in one layer with conductive lines in an adjacent layer. Additionally, contacts may extend vertically between the conductive lines and substrate-level features. Together, the lines, vias, and contacts carry signals, power, and ground between the devices and allow them to operate as a circuit. Subsequent disclosure describes in detail the formation of higher-level interconnect layers. Accordingly, subsequent figures are abbreviated such that lower device features (such as substrates, source/drain features, gate structures, etc.) are no longer depicted. However, the same methods and concepts may apply to lower interconnect layers as well.

Figure 3:
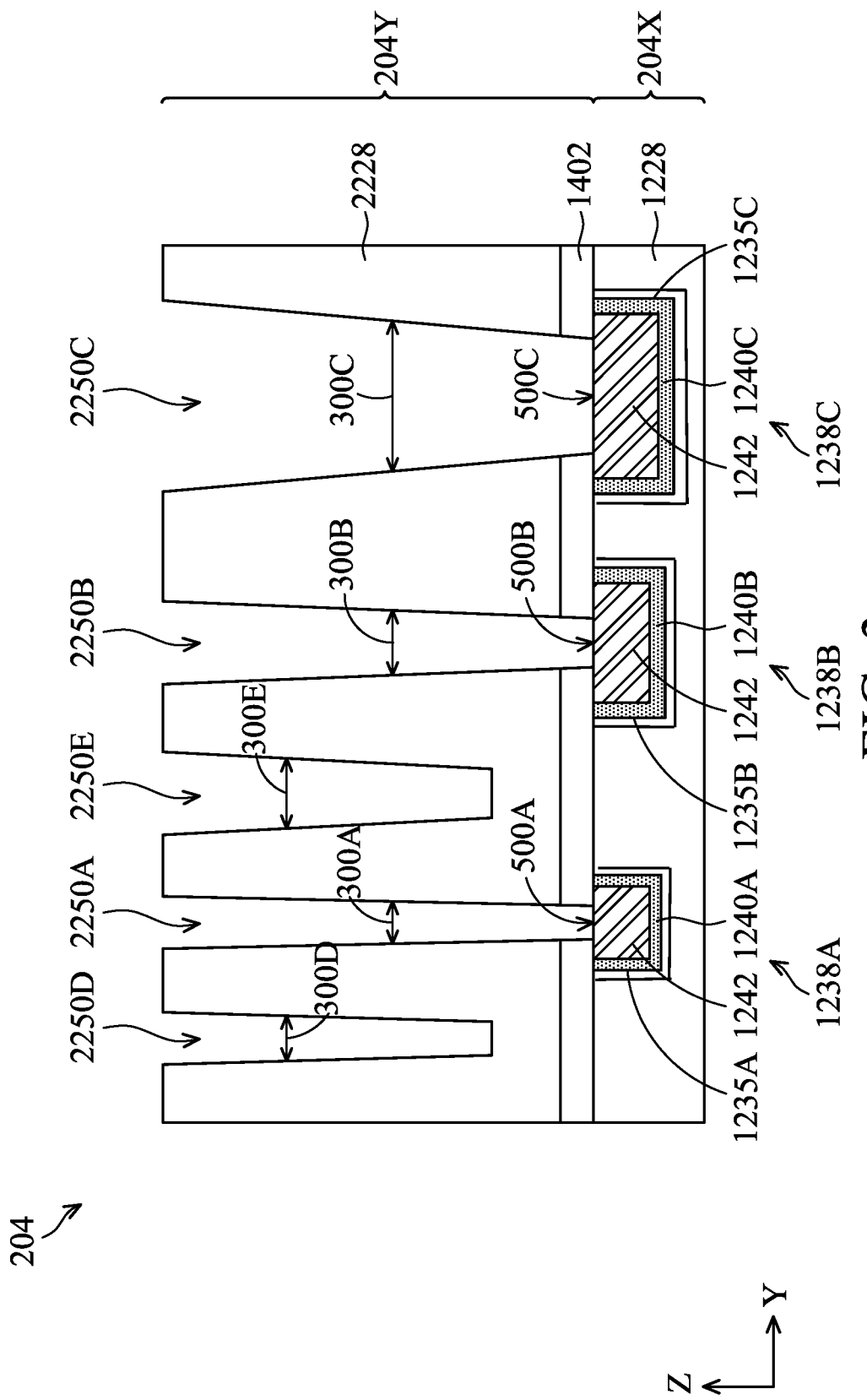
FIGS. 3-16, 18A-18D, and 19A-19D are cross-sectional side views of an interconnect structure of the present disclosure at various stages of fabrication according to various aspects of the present disclosure.
Figure 4:
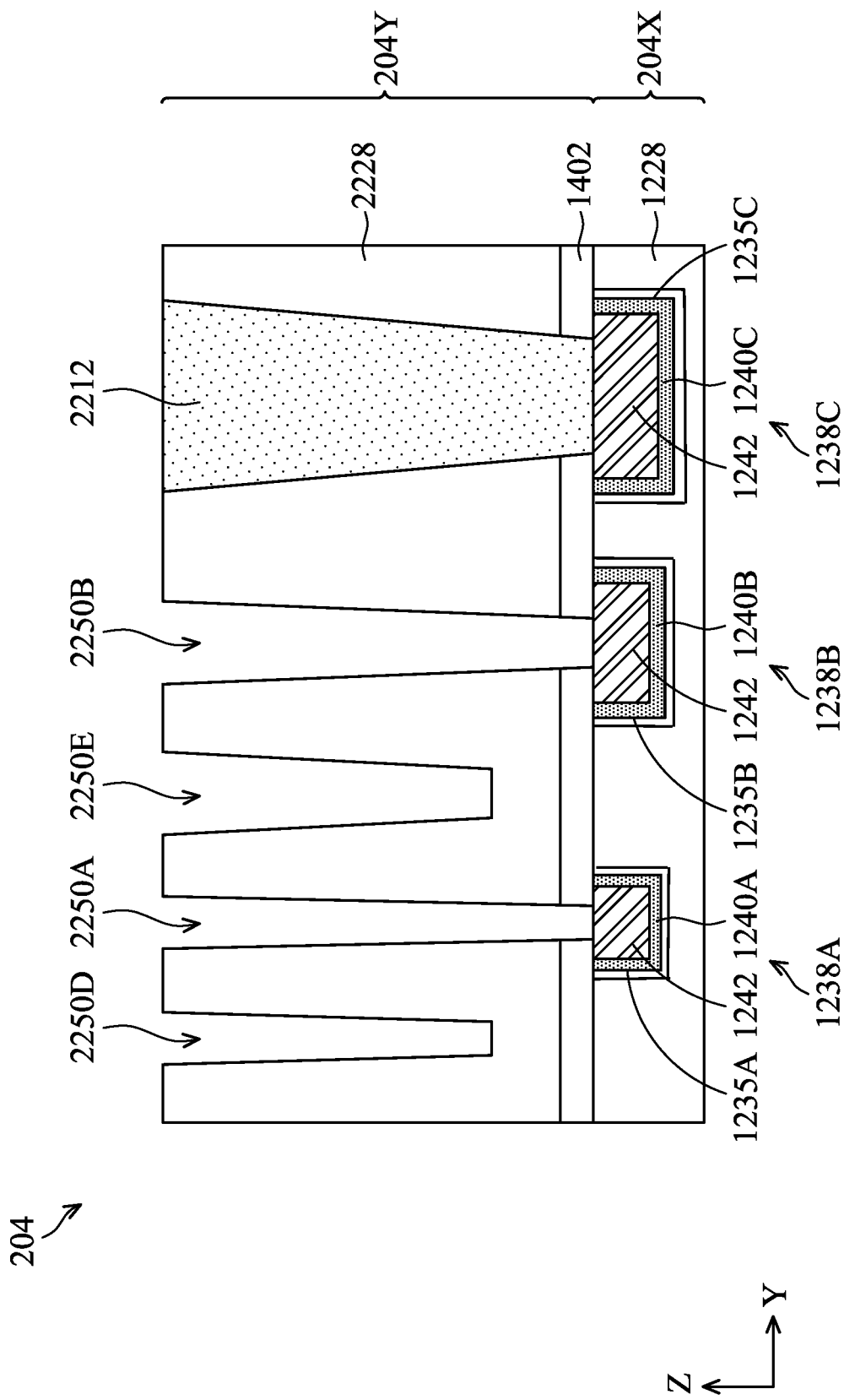

Referring to block 14 of FIG. 1A and to FIG. 3, interconnect layer 204X is one of the interconnect layers described above. In some embodiments, the interconnect layer 204X may be the interconnect layer 204A described above with respect to FIG. 2B. In some embodiments, the interconnect layer 204X may be the interconnect layer 204B that is immediately above the interconnect layer 204A of FIG. 2B. In some embodiments, the interconnect layer 204X may be the interconnect layer 204C, 204D, or any higher interconnect layers. The interconnect layer 204X includes an ILD layer 1228 and a plurality of conductive lines 1238A, 1238B, and 1238C that are similar to the ILD layer 228 and conductive lines 238 described above with respect to FIG. 2B, respectively. The conductive lines may have different dimensions. For example, the conductive line 1238A may have a relatively small dimension, the conductive line 1238C may have a relatively large dimension, and the conductive line 1238B may have a dimension between those of the conductive lines 1238A and 1238C. The dimensions may be determined by design needs. The conductive lines 1238A-1238C may generally resemble the conductive lines 238A-238C, respectively. For example, the conductive lines 1238A-1238C each includes a barrier layer 1235A-1235C, a liner 1240A-1240C, and a fill material layer 1242A-1242C. In some embodiments, the conductive lines further includes line caps 1244A-1244C. However, in some embodiments, the line caps 1244A-1244C are not formed.

An etch stop layer 1402 is formed over the top surface of the interconnect layer 204X. For example, the etch stop layer 1402 is formed on top surfaces of the liners 1240A, 1240B, and 1240C, as well as on top surfaces of the fill materials 1242A, 1242B, and 1242C. In some embodiments, liner caps are not formed. In other words, the etch stop layer 1402 directly interfaces with the liners 1240A, 1240B, and 1240C, as well as with the fill materials 1242A, 1242B, and 1242C, respectively. Subsequently, ILD layer 2228, also similar to the ILD layer 228 is formed on top of the etch stop layer 1402. In the depicted embodiment, the ILD layer 2228 is a portion of a higher interconnect layer 204Y.

The etch stop layer 1402 may be different in composition than the ILD layers 1228 and 2228, and may have a different etch selectivity to prevent over-etching when patterning the ILD layers 2228. In some examples, a uniform etch stop layer is formed over both the underlying ILD layer 1228 and the conductive lines 1238A, 1238B, and 1238C. Such an etch stop layer may include a semiconductor oxide, a semiconductor nitride, a semiconductor oxynitride, a semiconductor carbide, and/or other suitable dielectric material. This type of etch stop layer may be formed using any suitable process including ALD, PEALD, CVD, PECVD, HDP-CVD, and/or other suitable deposition processes, and may be formed to any suitable thickness. Alternatively, an etch stop layer may be formed by any other suitable methods. A CMP process may be performed after the etch stop layer is deposited. As discussed above, the CMP process may remove any excess material and may planarize the workpiece 200.

Referring to block 16 of FIG. 1 and to FIG. 3, the ILD layer 2228 is patterned to form a plurality of trenches, such as trenches 2250A-2250E. In the depicted embodiments, trenches 2250A-2250C are configured to expose a top surface of the fill material 1242A-1242C of the conductive lines 1238A-1238C, respectively. For example, surface portion 500A of the conductive lines 1238A, surface portion 500B of the conductive lines 1238B, and surface portion 500C of the conductive lines 1238C are exposed in the trenches. In other words, trenches 2250A-2250C extend from top surface of the ILD layer 2228 through a bottom surface of the ILD layer 2228 and further through the etch stop layer 1402, so as to reach the top surface of the fill material 1242A-1242C of the conductive lines 1238A-1238C, respectively. Accordingly, the etch stop layers 1402 have sidewall surfaces exposed in the trenches 2250A-2250C. In the depicted embodiments, the trenches 2250D and 2250E do not extend through the entire height dimension of the ILD layer 2228 on the illustrated cross section. However, trenches 2250D and 2250E may extend through the ILD layer 2228 on other cross sections to expose portions of other conductive lines or other device features. In the depicted embodiments, trenches 2250A-2250E are configured for via features formed therein. In some embodiments, the trenches 2250D and 2250E are for dummy lines, or omitted entirely.

In the depicted embodiments, the trench 2250A has a width 300A along the Y-direction. The trench 2250B has a width 300B along the Y-direction; trench 2250C has a width 300C along the Y-direction; trench 2250D has a width 300D along the Y-direction; and trench 2250E has a width 300E along the Y-direction. In some embodiments, the trenches have varying widths along the height dimension (e.g. along the Z-direction) of the trenches. In such embodiments, the widths 300A-300E represent average widths of the trenches along the height dimension. Accordingly, the widths 300A-300E may be interchangeably referred to as average widths 300A-300E, respectively. In some embodiments, the sidewalls of the trenches 2250A-2250E are substantially straight. Accordingly, the average widths 300A-300E are the same as the widths of the trenches 2250A-2250E at their respective mid-height along the Z-direction. Accordingly, the average widths 300A-300E are further interchangeably referred to as the mid-height widths 300A-300E.

The trenches 2250A-2250E may be formed by any suitable methods. For example, a first photoresist is formed on the ILD layer 2228 and patterned in a photolithographic process to selectively expose portions of the ILD layer 2228 to etch to define the vias. A photolithographic system exposes the photoresist to radiation in a particular pattern determined by a mask. Light passing through or reflecting off the mask strikes the photoresist thereby transferring a pattern formed on the mask to the photoresist. Additionally or in the alternative, the photoresist may be exposed using a direct write or maskless lithographic technique, such as laser patterning, e-beam patterning, and/or ion-beam patterning. Once exposed, the photoresist is developed, leaving the exposed portions of the resist, or in alternative examples, leaving the unexposed portions of the resist. An exemplary patterning process includes soft baking of the photoresist, mask aligning, exposure, post-exposure baking, developing the photoresist, rinsing, and drying (e.g., hard baking).

The portions of the ILD layer 2228 exposed by the photoresist and portions of the etch stop layer 1402 directly underneath are then etched using any suitable etching technique such as wet etching, dry etching, RIE, and/or other etching methods. In some embodiments, the etching process includes dry etching using an oxygen-based etchant, a fluorine-based etchant (e.g., $CF_4$, $SF_6$, $CH_2F_2$, $CHF_3$, and/or $C_2F_6$), a chlorine-based etchant (e.g., $Cl_2$, $CHCl_3$, $CCl_4$, and/or $BCl_3$), a bromine-based etchant (e.g., HBr and/or $CHBR_3$), an iodine-based etchant, other suitable etchant gases or plasmas, and/or combinations thereof. The etching technique and etchants may be varied to selectively etch the different materials of the ILD layer 2228 and of the etch stop layer 1402.

In some embodiments, the trenches 2250A-2250E have different dimensions. For example, the width 300A is smaller than the width 300B, and the width 300B is smaller than the width 300C. Moreover, the width 300D is similar to the width 300A, and the width 300E is similar to the width 300B. As described in more details below, the widths of the trenches 2250A-2250E determine the material that are used to fill the respective trenches. In some embodiments, the width 300A of the trench 2250A is less than a lower threshold width T1; the width 300C is greater than T2; and the width 300B is between T1 and T2. The details of the threshold widths T1 and T2 are described in detail later. In some embodiments, the width 300D is also less than T1, and the width 300E is between T1 and T2. As described in detail below, trenches having dimensions less than T1 are subsequently filled with a first type of conductive material tailored for minimal resistance in low dimensional conductive features (referred to herein as LD-type conductive materials); trenches having dimensions greater than T2 are subsequently filled with a second type of conductive material tailored for minimal resistance in high dimensional conductive features (referred to herein as HD-type conductive materials); and trenches having dimensions between T1 and T2 are subsequently filled with hybrid material structure that includes a layer of the LD-type conductive material and a layer of the HD-type conductive material. These material options are described in detail later.

Referring to FIGS. 4-9, trenches 2250A-2250E are filled with their respective proper materials. At this stage, the method 10 may proceed to block 18 of method A or to block 17 of method B. The disclosure below first describes method A with respect to FIGS. 4-10. Method B will be described in detail later with respect to FIGS. 11-16.

In some embodiments, the LD-type conductive material is deposited before the HD-type conductive material. Accordingly, referring to block 18 of FIG. 1 and FIG. 4, trenches not designed to include the LD-type conductive materials (such as trenches 2250C) are first filled with a blocking layer 2212. The blocking layer 2212 occupies the trenches during at least the deposition of the LD-type conductive materials, and are subsequently removed for the deposition of the HD-type conductive materials. In some embodiments, the blocking layer 2212 includes a dielectric material, such as a high viscosity dielectric material, that is configured to fill in only trenches having a large dimension (such as having widths the greater than the threshold width T2). Accordingly the blocking layer 2212 is not formed in trenches 2250A, 2250B, 2250D, and 2250E. For example, the dielectric material may have large molecular sizes to reduce the probability of filling trenches having lower dimensions. In some embodiments, the blocking layer 2212 may include azoles (such as benzotriazole, tolyltriazole), amines (such as diphenylamine), other suitable dielectric materials, derivatives thereof, or combinations thereof. In some embodiments, the blocking layer 2212 may include 4-Methylbenzotriazole, 5-Methylbenzotriazole, benzotriazole with C1, C4, C6, or C8 alkyl chains tethered thereon, 6-(5-methyl-2-oxo-imidazolidin-4-yl)-hexanoic acid, N-phenyl-1,4-phenylenediamine (NPPD), etc. In some embodiments, the blocking layer 2212 is interchangeably referred to as the passivation layer 2212. Moreover, as described in detail later, the dielectric material of the blocking layer 2212 may be removed by pyrolysis. Accordingly, the dielectric material may have a relatively low pyrolysis temperature, for example, a pyrolysis temperature that is less than about 400° C. If the pyrolysis temperature is too high, residues of the blocking layer 2212 may remain in the trenches 2250C, which increases the resistance in subsequently formed conductive features 2238C therein.

The blocking layer 2212 may be formed using any suitable methodologies. For example, Chemical Vapor Deposition, Physical Vapor Deposition (PVD), atomic layer deposition, spin coating, any other suitable deposition technologies, or combinations thereof may be used. In some embodiments, the deposition process is configured to reduce the deposition in the low dimensional trenches 2250A, 2250B, 2250D, and 2250E. In some embodiments, the dielectric material fills the trench 2250C entirely. A CMP process may be used to planarize the top surface of the interconnect layer 204Y. In some embodiments, the blocking layer has a height (along the Z-direction) dimension that is greater than about 100 Å.

Figure 5:
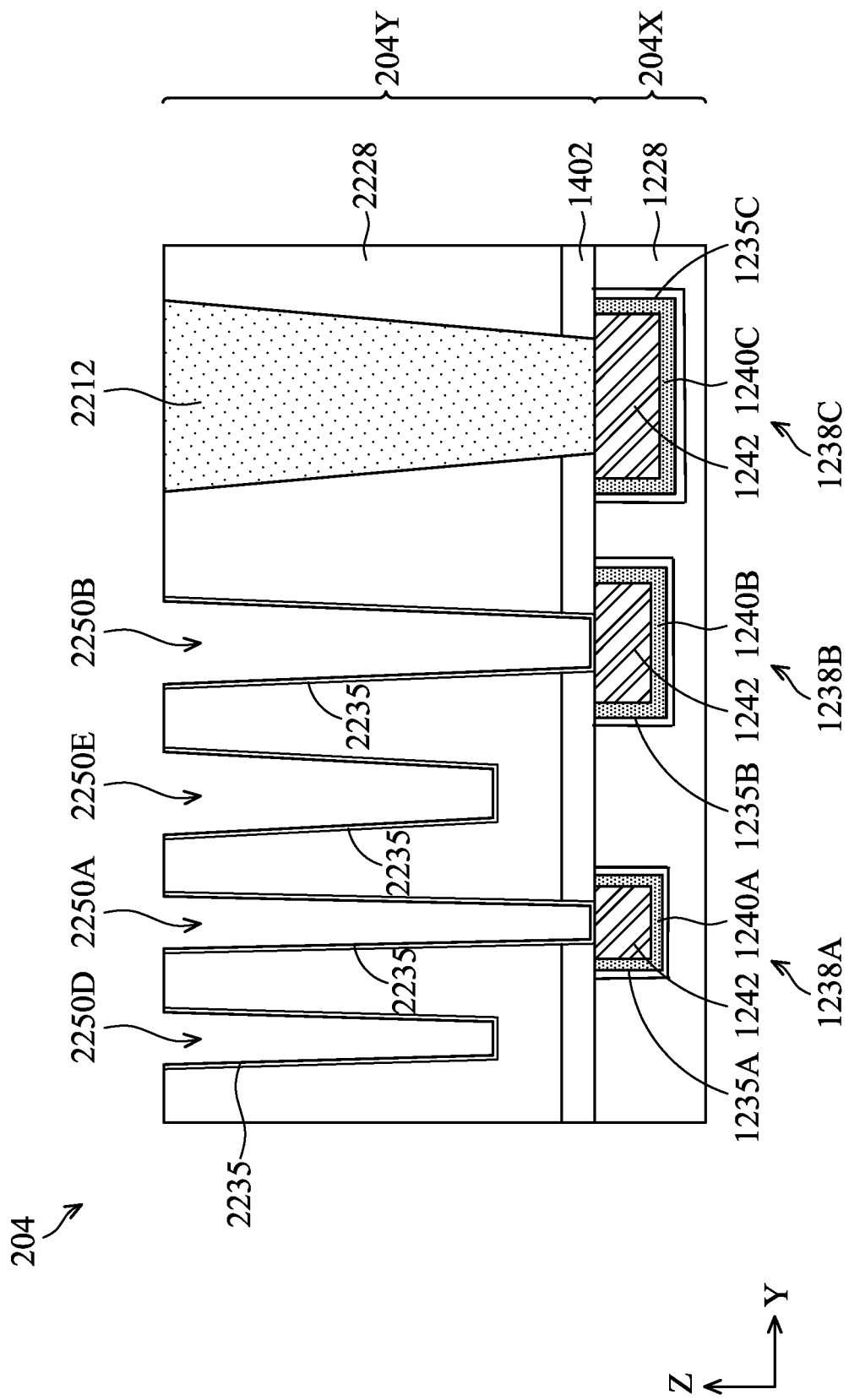

Referring to block 20 of FIG. 1 and FIG. 5, barrier layers 2235 are formed in the opening trenches, for example, trenches 2250A, 2250B, 2250D, and 2250E. The barrier layers 2235 cover sidewall surfaces and bottom surfaces of the respective trenches. For example, the barrier layer 2235 directly interfaces with the conductive lines 1238A-1238B of the bottom surface of the trenches 2250A and 2250B. Moreover, the barrier layer 2235 also directly contacts the exposed sidewall surfaces of the etch stop layer 1402. The barrier layers 2235 resemble barrier layer 235 described above with respect to FIGS. 2A and 2B. The barrier layers 2235 may prevent conductive material (that subsequently fill the trenches) from diffusing outward into the workpiece 200 to cause performance issues. Because the trench 2250C has been filled with the blocking layer 2212, barrier layer 2235 is not formed therein. In some embodiments, the barrier layer 2235 forms on top surfaces of workpiece 200. A CMP process is conducted to remove the barrier layer 2235 on the top surface and planarize the top surface of workpiece 200.

Figure 6:
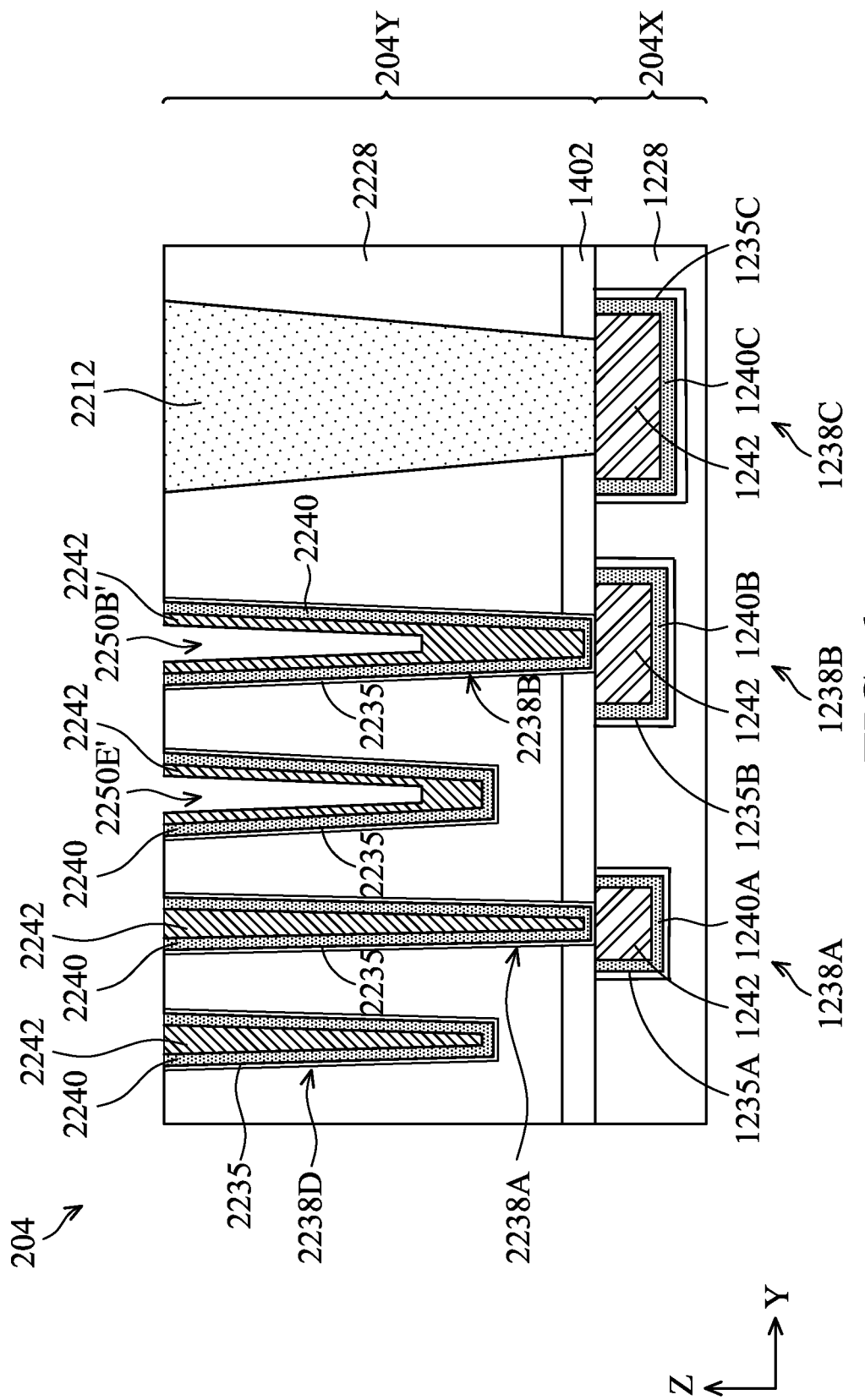

Referring to block 22 of FIG. 1 and FIG. 6, conductive features 2238A, 2238B, 2238D, and 2238E are then formed in the trenches and directly contact the sidewall surfaces and bottom surfaces of the barrier layer 2235. The conductive features 2238A, 2238B, 2238D, and 2238E each include a liner layer 2240. The liner layer 2240 resemble the liner 240 described above with respect to FIG. 2B. In various examples, the liner 240 includes TiN and/or TaN. The liner 240 may be formed using any suitable process including ALD, PEALD, CVD, PECVD, HDP-CVD, and/or other suitable deposition processes and may be formed to any suitable thickness, and in various examples, the liner 240 has a thickness between about 1 nm and about 5 nm. In some embodiments, the liner layer 2240 is a conformal layer and has a substantially uniform thickness across its profile. As described above, the conductive features 2238D and 2238E may be conductive features similar to those of conductive features 2238A and 2238B, respectively, and are connected to underlying conductive lines not illustrated on the cross sections here. However, in some other embodiments, the conductive features 2238D and 2238E may be dummy lines.

Still referring to block 22 of FIG. 1 and FIG. 6, conductive fill materials are deposited into the remaining spaces of the open trenches 2250A, 2250B, 2250D, and 2250E thereby forming fill material layers 2242. The fill material layers 2242 are formed on and directly interfaces with the liner layer 2240. For trenches having lower dimensions, such as trenches 2250A and 2250D, the fill material layer 2242 fills the remaining space of the respective trenches completely. For trenches having higher dimensions, such as trenches 2250B and 2250E, the fill material layer 2242 only partially fills the remaining space of the respective trenches, and leaves trench portions 2250B' and 2250E' respectively. The fill material layer 2242 may be formed using any suitable process including ALD, PEALD, CVD, PECVD, HDP-CVD, Physical Vapor Deposition (PVD), and/or other suitable deposition processes. In some embodiments, the fill material layer 2242 also forms on top of the ILD layer 2228, and a CMP is subsequently performed to planarize the top surface and to expose the liner layer 2240. In some embodiments, the fill material layer 2242 includes an LD-type conductive material. The details of the LD-type conductive material will be described later.

Figure 7:
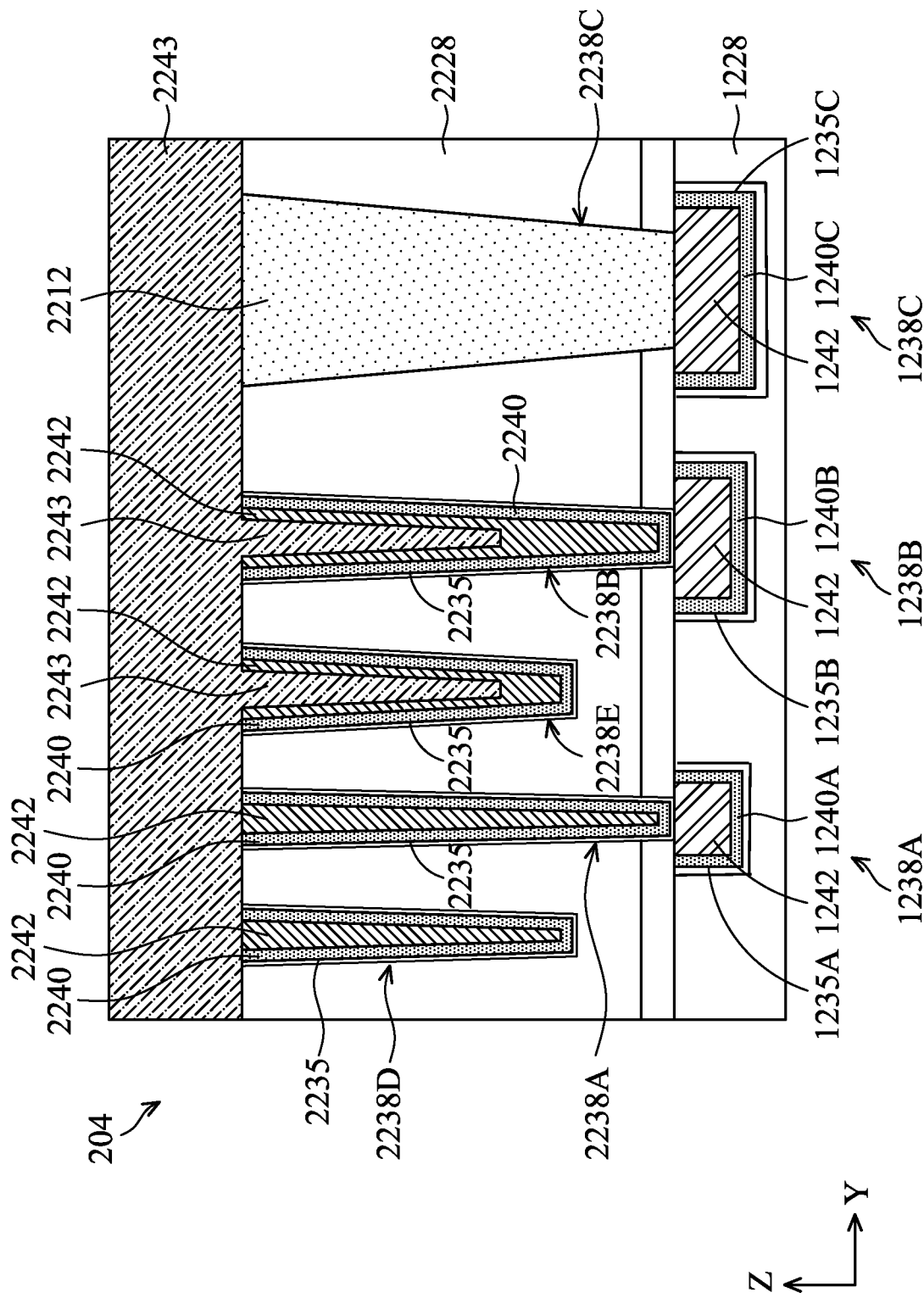

Referring to FIG. 7, an HD-type conductive material is deposited into the trench portions 2250B' and 2250E', thereby forming fill material layers 2243. The fill material layer 2243 fills the trench portions 2250B' and 2250E' completely. In some embodiments, the HD-type conductive material are also formed on top surfaces of the ILD layer 2228, as well as on top surface of the liner layer 2240 and the top surface of the fill material layer 2242. The details of the HD-type conductive material will be described later.

Figure 8:
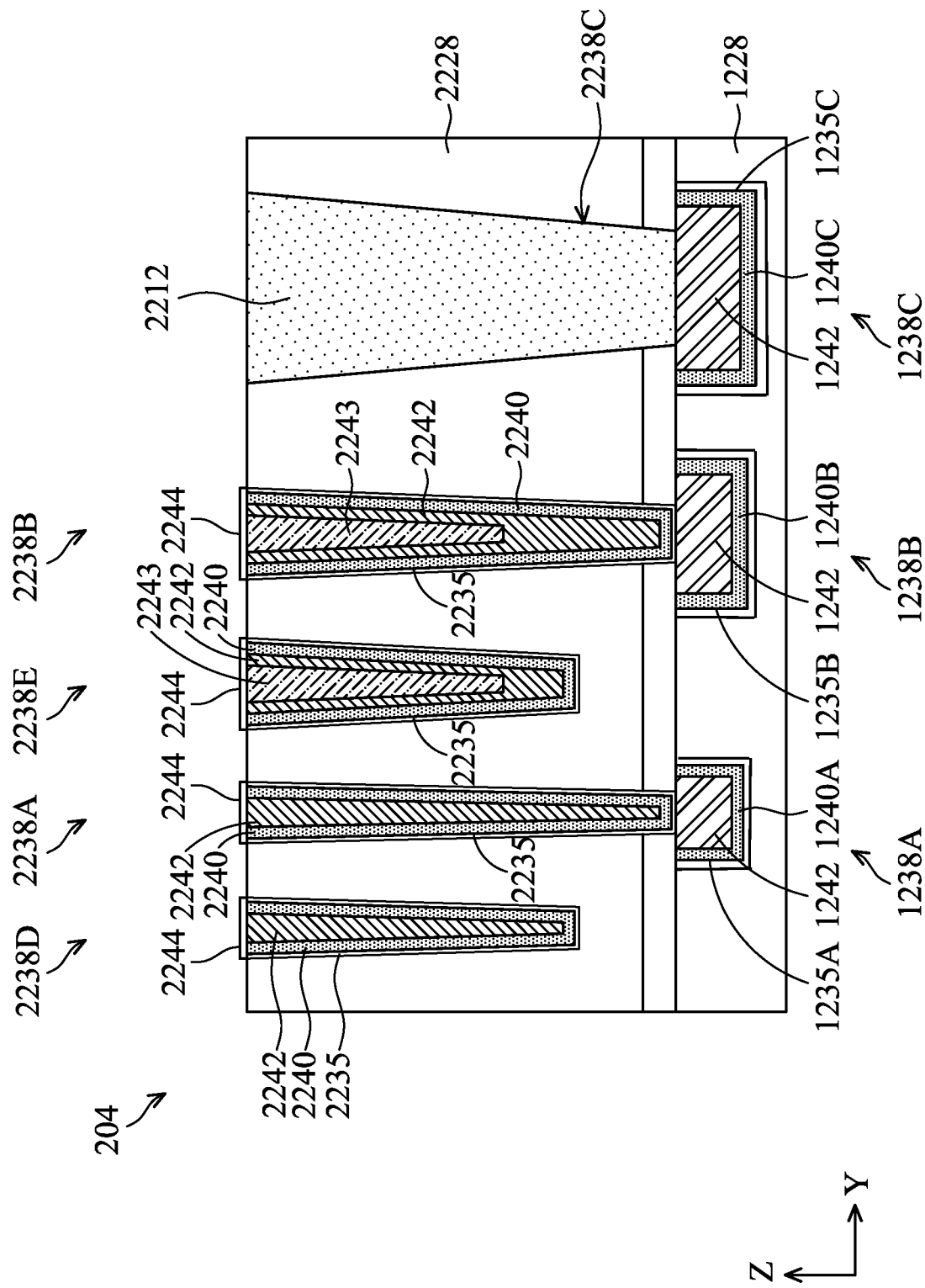

Referring to FIG. 8, a CMP operation is then performed to remove the excess HD-type conductive material, and to expose the top surfaces of the LD-type conductive material of the fill material layer 2242. The liner layer 2240, the fill material layers 2242, and the fill material layers 2343 collectively form conductive features 2238A, 2238B, 2238D and 2238E. In some embodiments, line caps 2244 are formed on top surfaces of the fill material layers 2242 and fill material layers 2243. The line caps 2244 are substantially similar to the line caps 244 described above with respect to FIG. 2B, and may be deposited by any suitable process including ALD, PEALD, CVD, PECVD, HDP-CVD, and/or other suitable deposition processes. The line cap 2244 may include any suitable conductive material including metals, metal oxides, metal nitrides, other suitable materials, and/or combinations thereof. The line cap 2244 may be formed to any suitable thickness, and in various examples, the line cap 2244 has a thickness between about 1 nm and about 5 nm. In some embodiments, the line caps 2244 protect the conductive features 2238A, 2238B, 2238D, and 2238E during subsequent processing (such as the pyrolysis and/or plasma treatment) of the workpiece 200.

Figure 9:
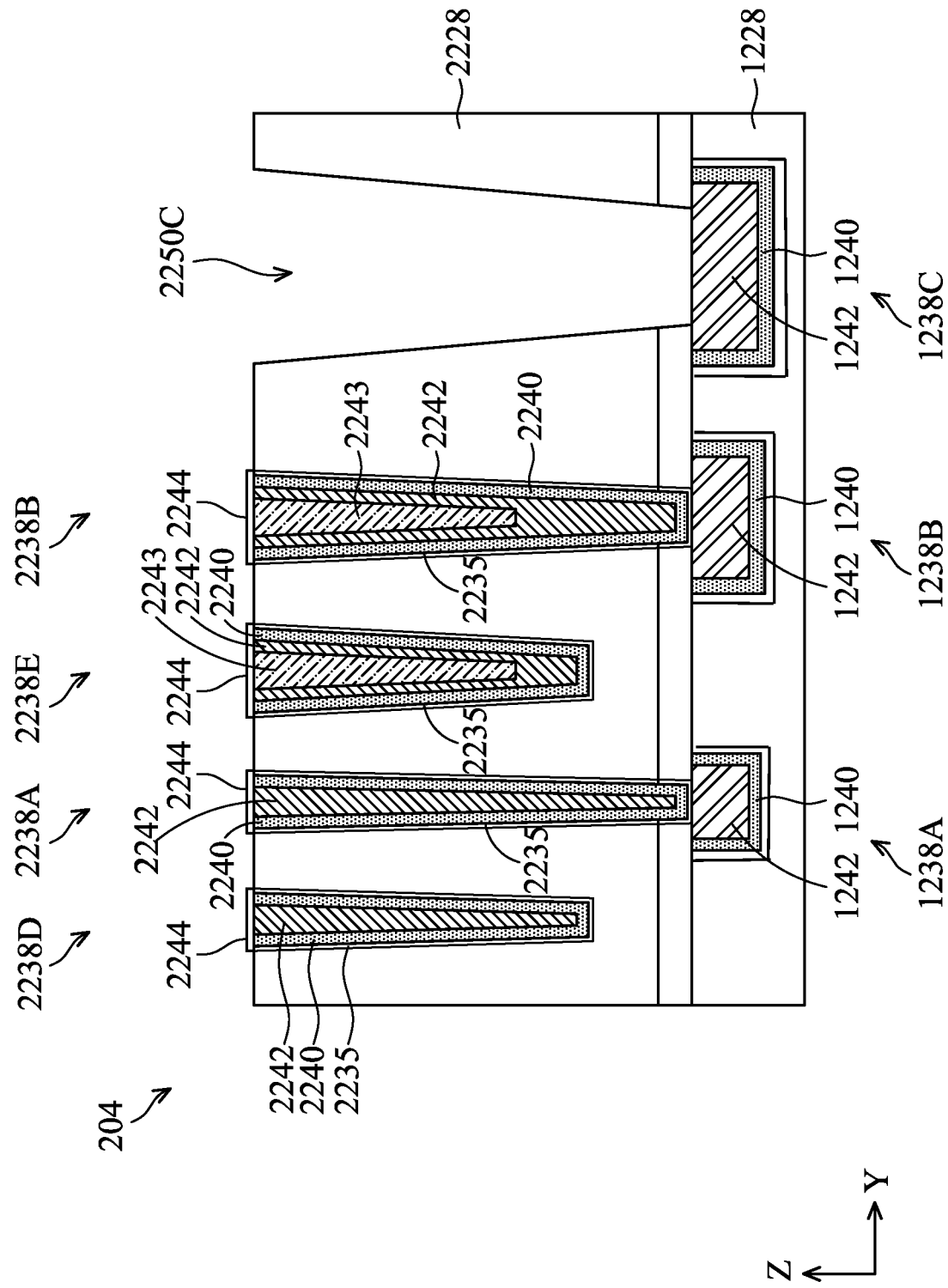

Referring to block 24 of FIG. 1 and FIG. 9, the blocking layer 2212 is removed to regenerate the trench 2250C. In some embodiments, the blocking layer 2212 is entirely removed, such that the top surface of the underlying conductive line 1238C are exposed in the trenches 2250C. The removal of the blocking layer 2212 can use any suitable methods. In some embodiments the blocking layer 2212 is removed by a thermal activation process. For example, a pyrolysis operation may be used, which heats the workpiece 200 to a temperature above the pyrolysis temperature of the blocking layer material. Alternatively, the blocking layer 2212 may be removed by a plasma treatment. For example the plasma treatment may implement plasma sources including, for example, argon (Ar), hydrogen ($H_2$), H-radical, nitrogen ($N_2$), ozone ($O_3$), any other suitable plasma sources, or combinations thereof.

Figure 10:
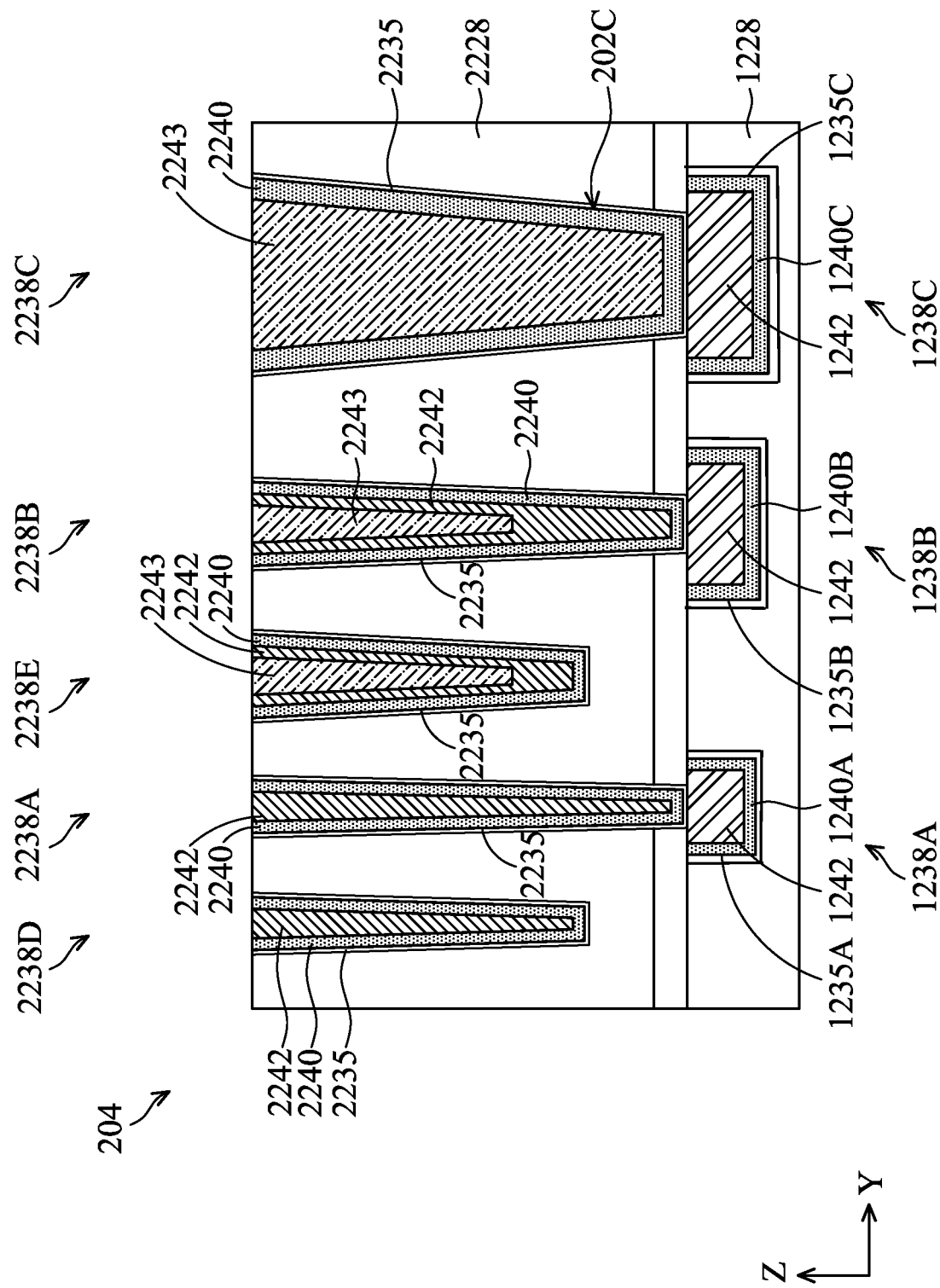

Referring to block 26 of FIG. 1 and FIG. 10, barrier layer 2235 is formed in the open trenches 2250C. In some embodiments, the barrier layer 2235 covers the bottom surface of the trench 2250C and conceals the top surfaces of the underlying conductive line 1238C. The barrier layer 2235 may implement a same material as those barrier layer 2235 described above. Liner layer 2240 is formed on top of the barrier layer 2235, such as on sidewall surfaces and bottom surface of the barrier layer 2235. The liner layer 2240 is also substantially similar to the liner layer 2240 described above. Subsequently, HD-type fill material is deposited into the remaining space of the trenches 2250C to form the fill material layer 2243. In some embodiments, the HD-type fill material also covers portions of the ILD layer 2228. A CMP operation is used to remove the excess HD-type fill material, and to planarize the top surface. The CMP operation further exposes top surfaces of the other conductive features, such as conductive features 2238A, 2238B, 2238D and 2238E, for example, by removing the liner caps 2244. At this stage, the fabrication of interconnect layer 204Y is completed. In some embodiments, an interconnect layer 204Z may be formed on top of the interconnect layer 204Y using methodologies described above with respect to FIGS. 3-10, one of the alternative methodologies described further below, or combinations thereof.

As described above, the barrier layers 2235 prevents diffusion of the conductive fill materials into unintended portions of the workpiece 200, such as the ILD layer 2228 surrounding the conductive features 2238A-2238E. However, in some embodiments, the presence of the barrier layer 2235 increases the contact resistance between the conductive features 2238A-2238C with the underlying conductive lines 1238A-1238C. This problem is particularly pronounced for features of lower dimensions. Accordingly, the following disclosure provides the method B where the barrier layer 2235 does not interpose between the conductive features 2238A-2238C and the underlying conductive lines 1238A-1238C, such that the overall resistance in the interconnect structure is further reduced.

Figure 11:
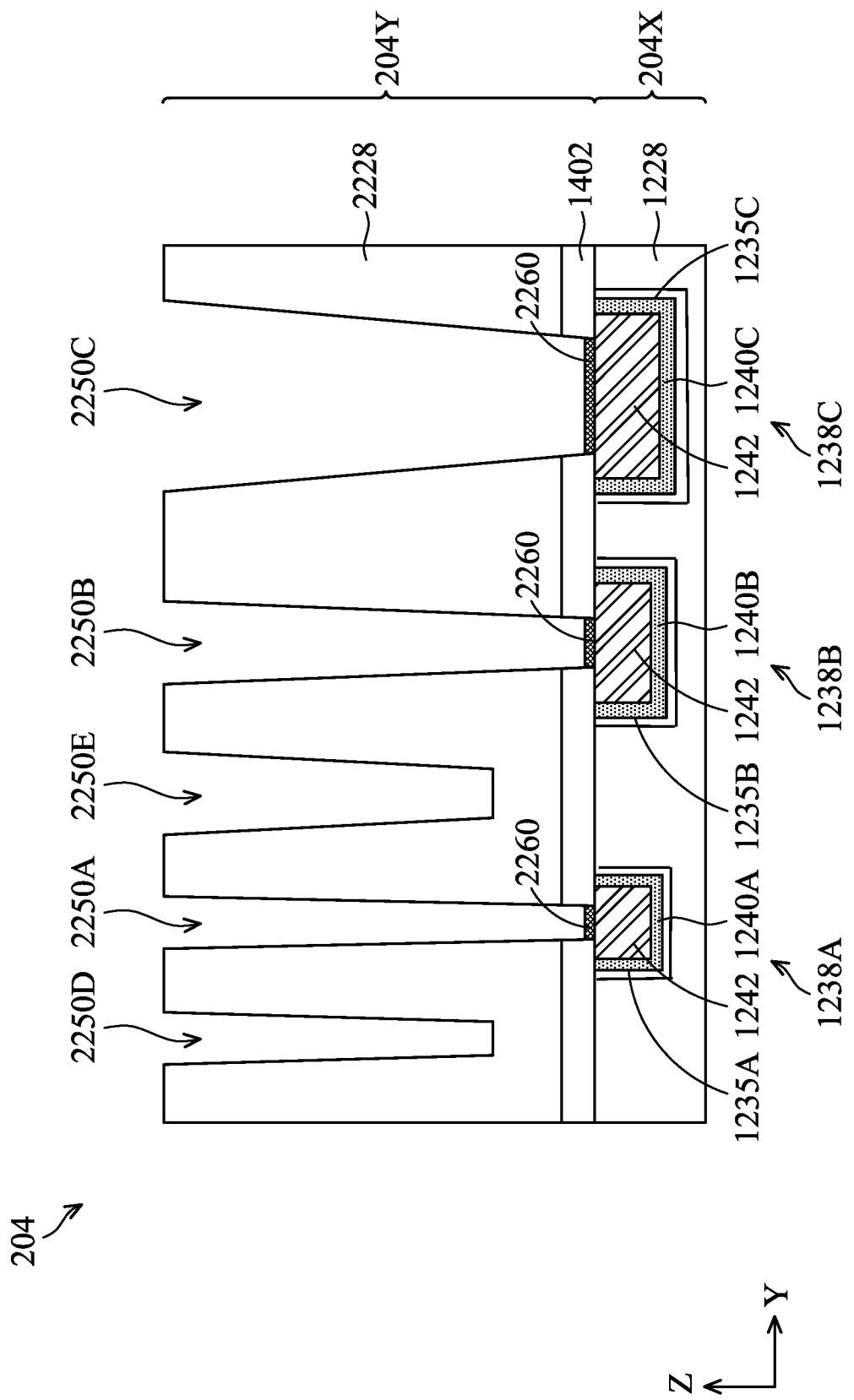

Referring to block 17 of FIG. 1 and FIG. 11, which proceeds from block 16 of FIG. 1 and from the workpiece 200 illustrated in FIG. 3. As illustrated in FIG. 11, a passivation layer 2260 is formed on the exposed surface portions 500A-500C of the underlying conductive lines 1238A-1238C. The formation of the passivation layer 2260 may use any suitable technologies. In some embodiments, the formation of the passivation layer 2260 may be selective to a metal surface. Accordingly, the passivation layer 2260 is only formed on the exposed top surfaces of the conductive lines 1238A to 1238C, such as the surface portions 500A-500C, and not on sidewall surfaces of the ILD layer 2228. The sidewall surfaces of the ILD layer 2228, and a portion of the sidewall surfaces of the etch stop layer 1402 remain exposed. The presence of the passivation layer 2260 on top surfaces of the underlying conductive lines 1238A-1238C prevents the formation of barrier layer 2235 thereon, such that subsequent formation of conductive features 2238A-2238C have direct contact with the underlying conductive lines 1238A-1238C.

In some embodiments, the passivation layer 2260 has a material that is substantially different from the material of the ILD layer 2228. Accordingly, in a subsequent deposition process, selectivity may be achieved between the sidewall surfaces of the ILD layer 2228 and the top surfaces of the exposed passivation layer 2260. In some embodiments, the passivation layer 2260 is substantially similar to the blocking layer 2212 described above with respect to FIG. 4. In some embodiments, the material of the passivation layer 2260 may have a pyrolysis temperature that is higher than that of the blocking layer 2212. For example, the pyrolysis temperature of the passivation layer 220 may be 50° C. greater than that of the passivation layer 2212. In other words, the passivation layer 2260 is more thermally stable than the blocking layer 2212 under, for example, a thermal torture treatment. As described later, this difference allows for selective removal of the blocking layer 2212 while maintaining the integrity of the passivation layer 2260. In some embodiments, the blocking layer 2212 includes benzotriazole, benzotriazole with C1, C4, C6, or C8 alkyl chains tethered thereon, other suitable materials, or combinations thereof; while the passivation layer 2260 includes a material selected from 4-methylbenzotriazole, 5-methylbenzotriazole, 6-(5-methyl-2-oxo-imidazolidin-4-yl)-hexanoic acid, and N-phenyl-1,4-phenylenediamine (NPPD), other suitable materials, or combinations thereof. In some embodiments, the pyrolysis temperature of the passivation layer 2260 may be about 420° C. to about 480° C. If the pyrolysis temperature is too low, such as lower than 420° C., the resistance difference to pyrolysis from the blocking layer 2212 may be insufficient. Alternatively or additionally, plasma treatment may be used to selectively remove the blocking layer 2212 without affecting the passivation layer 2260. In such embodiments, the materials of the layers are selected such that a difference is achieved under the plasma treatment condition.

In some embodiments the passivation layer 2260 has a thickness of about 10 Å to about 50 Å. If the thickness is too small, such as less than 10 Å, agglomeration may occur such that surface portions 500A-500C may remain partially exposed. As described later, complete coverage of the surface portions 500A-500C enable a barrier-free configuration between adjacent conductive features of different interconnect layers which reduces the overall resistance of the interconnect structure. Partial exposure of the surface portions 500A-500C may lead to partial formation of barrier layer thereon, and result in increased resistance. Conversely, if the thickness is too large, such as greater than 50 Å, subsequent pyrolysis may not effectively remove all residues of the passivation layer 2260. Such residues may also interfere with the electrical contact between adjacent conductive features leading to increased resistance.

Figure 12:
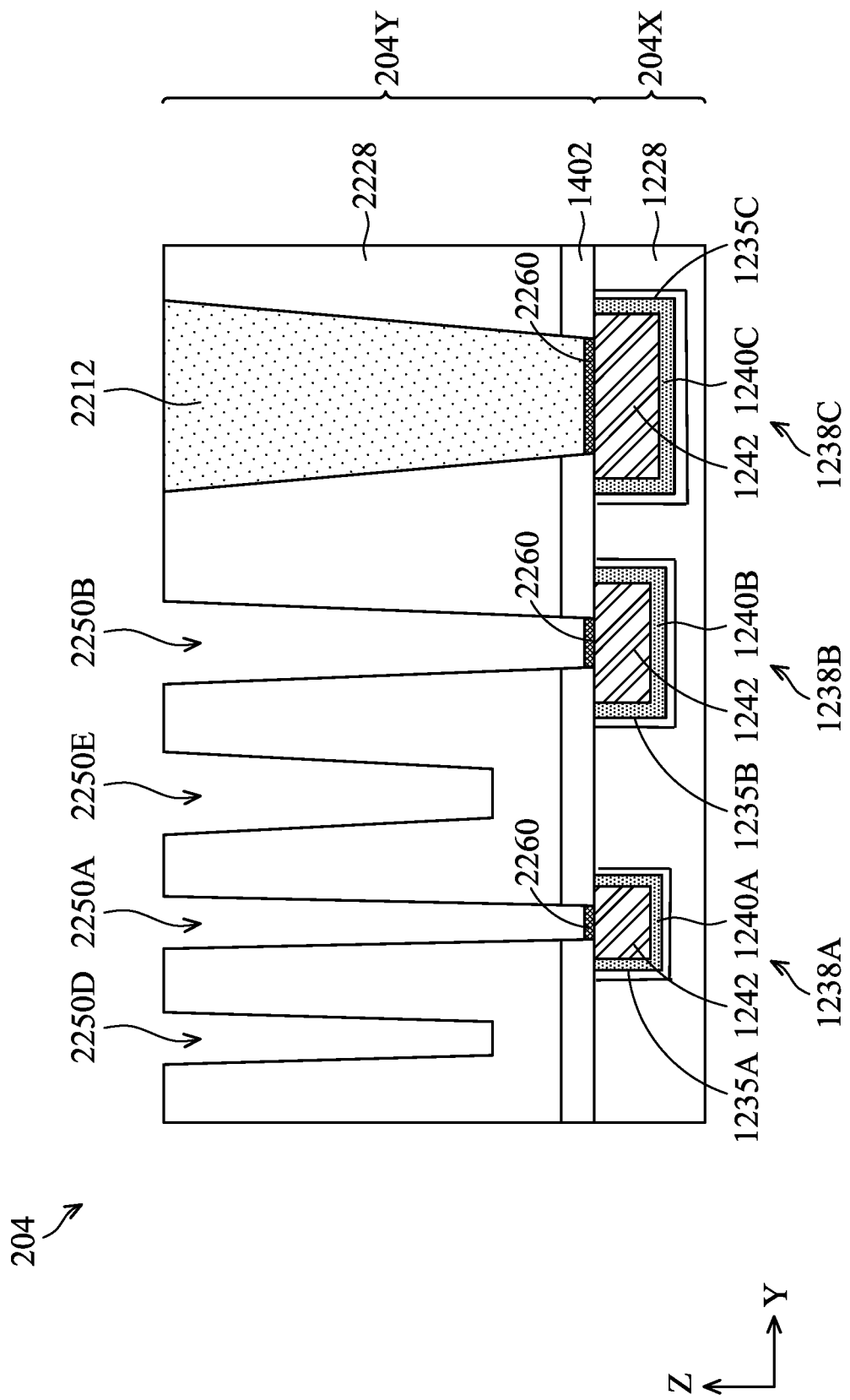

Referring to block 18 of FIG. 1 and FIG. 12, blocking layer 2212 is formed in the trenches 2250C, for example, on top surfaces of the passivation layer 2260, and on exposed sidewall surfaces of the ILD layer 2228. The blocking layer 2212 is substantially similar to the blocking layer 2212 described above with respect to FIG. 4.

Figure 13:
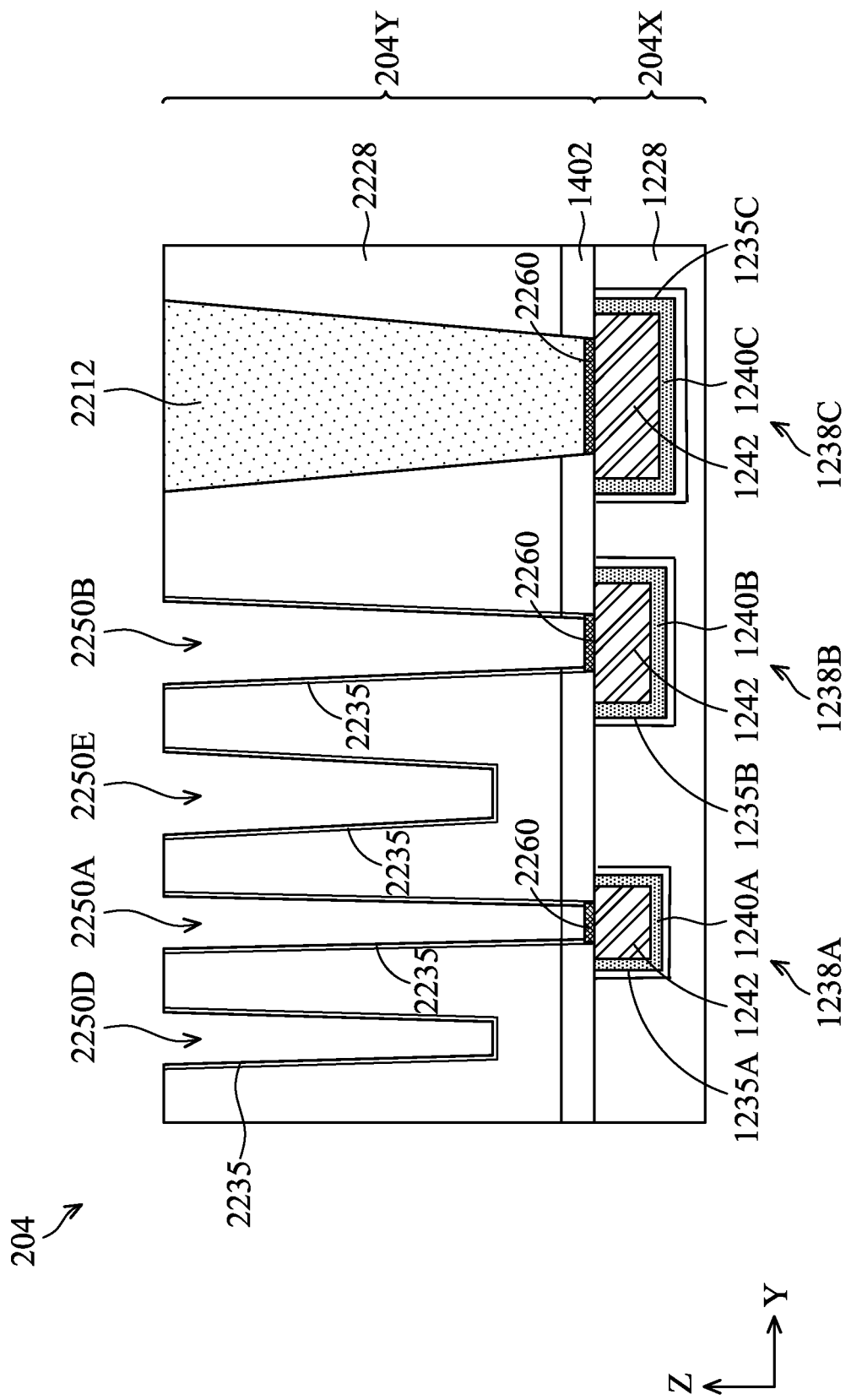

Referring to block 20 of FIG. 1 and FIG. 13, barrier layer 2235 is formed in open trenches 2250A-2250E. The barrier layer 2235 is substantially similar to the barrier layer 2335 described above. As described above, the materials of the ILD layer 2228 and that of the passivation layer 2260 are different. Accordingly, the deposition of the barrier layer 2235 may be configured to be selective and only forms on sidewall surfaces of the ILD layer 2228 and not on top surfaces of the passivation layer 2260. Accordingly, the barrier layer 2235 in trenches 2250A and 2250B each includes two opposing portions on exposed sidewall surfaces of the ILD layer 2228. The two portions of the barrier layer 2235 are disconnected at the top surfaces of the underlying conductive lines 1238A and 1238B. Rather, a segment of the passivation layer 2260 connect the two portions of the barrier layer 2235.

Figure 14:
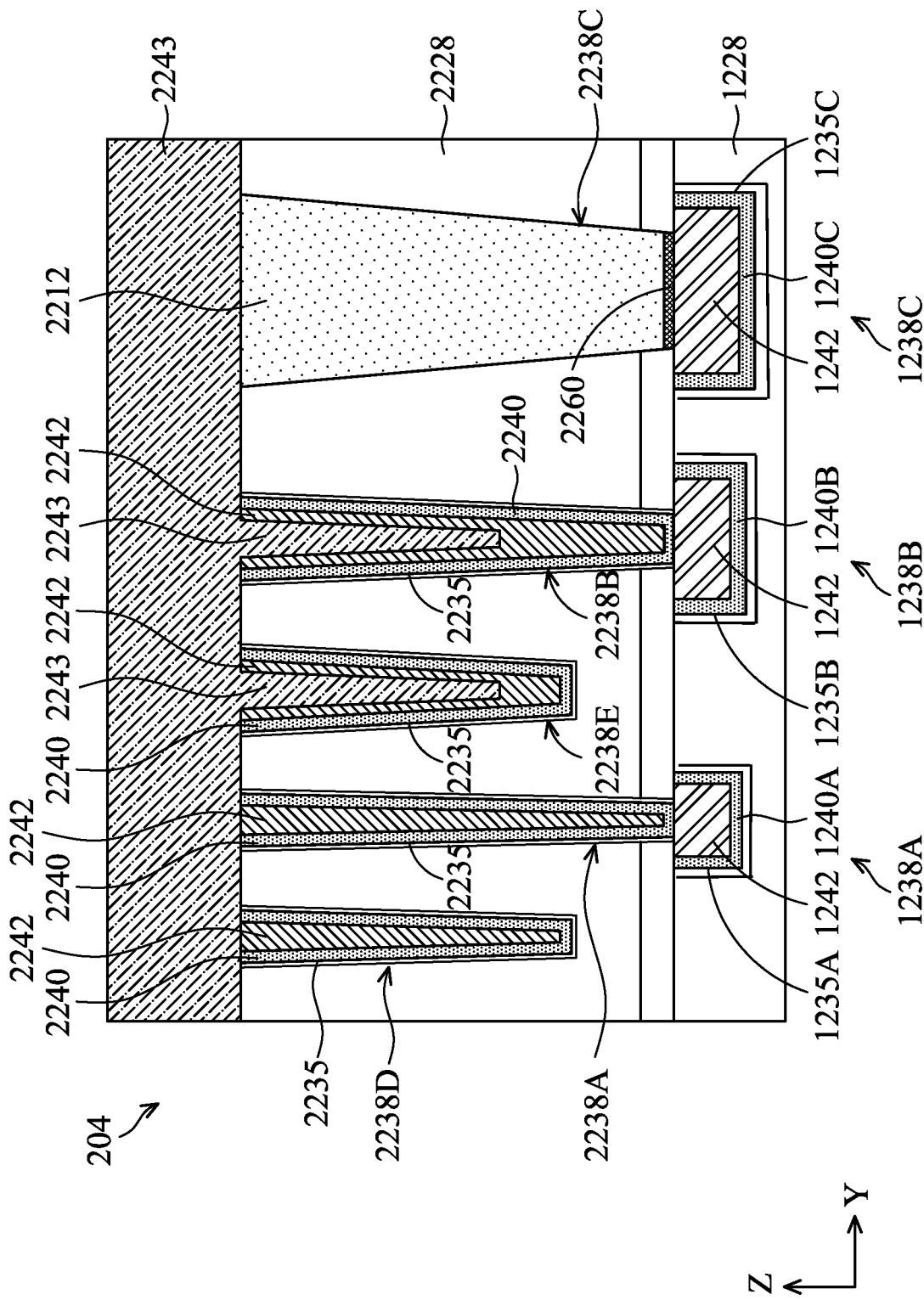

Referring to FIG. 14, after the formation of the barrier layer 2235, a pyrolysis treatment is conducted such that the passivation layers 2260 in trenches 2250A and 2250B are removed in their entireties. In other words, the surface portions 500A and 500B of the conductive features 2238A and 2238B become exposed. Referring to block 22 of FIG. 1, and still referring to FIG. 14, liner layers 2240 are then formed on the exposed surface portions 500A and 500B, as well as on sidewall surfaces of the barrier layer 2235. Fill material layers 2242 and 2243 are subsequently deposited into the remaining spaces of the trenches 2250A, 2250B, 2250D, and 2250E, using methods substantially similar to those described above with respect to FIGS. 7-8. However, in this embodiment, there are no barrier layers interposing between the underlying conductive lines 1238A, 1238B and the conductive features 2238A, 2238B in this embodiment.

Figure 15:
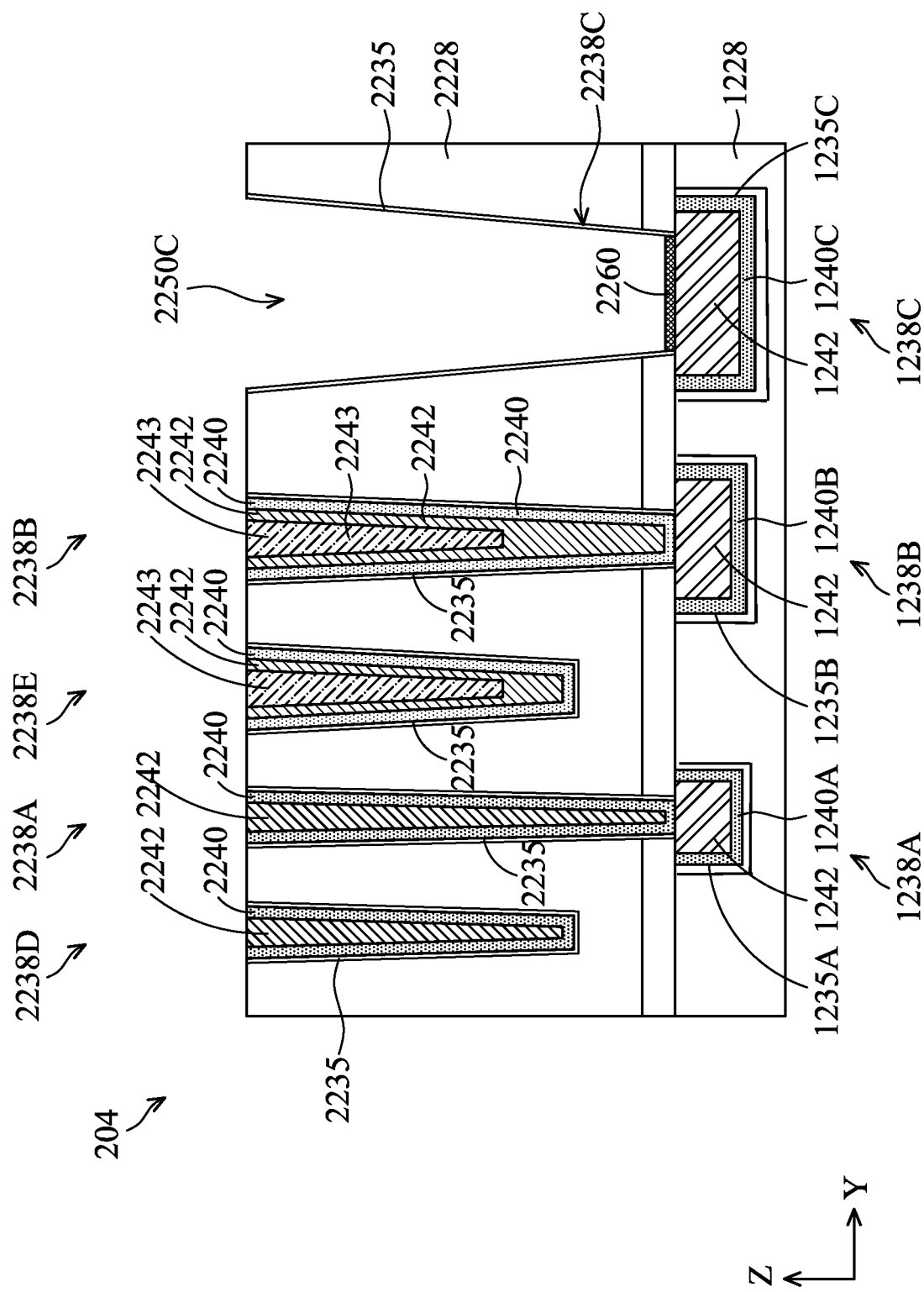

Referring to block 24 of FIG. 1 and FIG. 15, the blocking layer 2212 is then selectively removed without substantially affecting the integrity of the passivation layer 2260. For example, the removal of the blocking layer 2212 may implement a pyrolysis treatment. The temperature for the pyrolysis treatment is selected between the pyrolysis temperatures of the blocking layer 2212 and that of the passivation layer 2260. Accordingly, only blocking layer 2212 is removed. Subsequently, barrier layer 2235 is formed in the trench 2250C. As described above, maintaining the presence of the passivation layer 2260 prevents the formation of the barrier layer 2235 on the surface portion 500C of the underlying conductive line 1238C. Accordingly, the barrier layer 2235 includes two opposing portions each on an exposed sidewall surfaces of the ILD layer 2228. The two portions of the barrier layer 2235 are disconnected at the top surfaces of the underlying conductive lines 1238C. Rather, a segment of the passivation layer 2260 connect the two portions of the barrier layer 2235.

Figure 16:
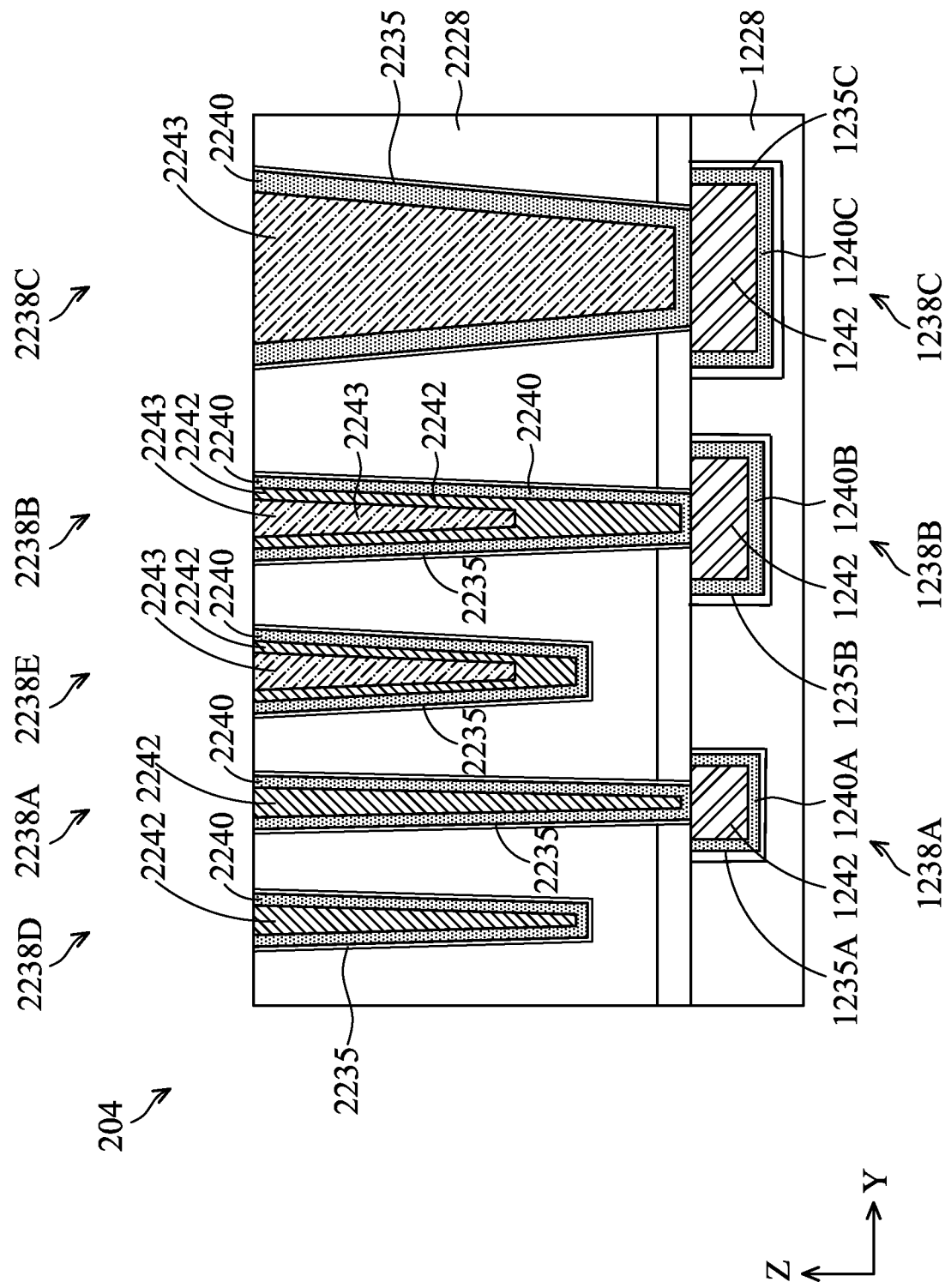
Figure 17:
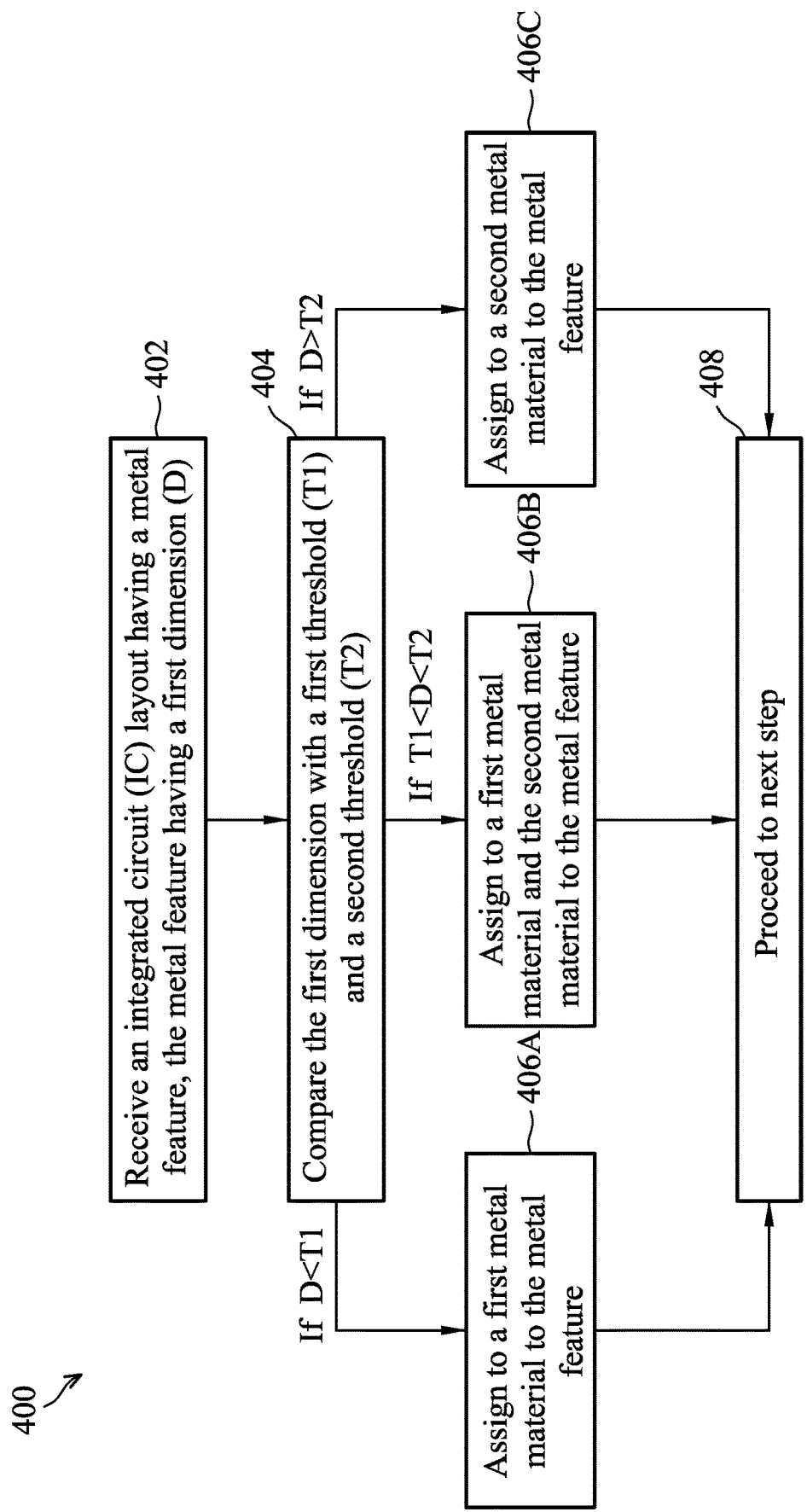
FIG. 17 is a flowchart illustrating a method of selecting fill materials for each conductive features of the interconnect structure of the present disclosure, according to various aspects of the present disclosure.

Referring to FIG. 16, a pyrolysis treatment is conducted at a temperature equal to or higher than the pyrolysis temperature of the passivation layer 2260. Accordingly, the passivation layer 2260 exposed in the trenches 2250C is removed, thereby exposing the surface portion 500C of the underlying conductive line 1238C. Particularly, the fill material(s) of the conductive line 1238C is exposed. Subsequently, referring to block 26 of FIG. 1 and FIG. 16, a liner layer 2240 is formed in the trenches 2250C. As illustrated in figure, the liner layer 2240 directly contacts the barrier layer 2235 on two sidewall surfaces of the trenches 2250C, and a bottom surface of the liner layer 2240 directly contacts the underlying conductive lines 1238C. Furthermore, an HD-type fill material is deposited on top of the liner layer 2240 to fill the remaining spaces of the trenches 2250C and to form the fill material layer 2243. In some embodiments, the deposition of the liner layer 2240 and the fill material layer 2243 are substantially similar to those deposition processes described above with respect to FIG. 10. However, there is no barrier layer interposing between the underlying conductive lines 1238C and the conductive features 2238C in this embodiment.

Accordingly, the disclosure above with respect to FIGS. 4-10 (that is, the method A), and that was respect to FIGS. 11-16 (that is, the method B) provide two embodiments for forming the interconnect layer 204Y. The method A has the benefit of simplicity and lower fabrication cost, and the method B has the benefit of further reduced contact resistances between the underlying conductive lines and the conductive features. The selection of the method may be a matter of design choice. In some embodiments, some of the conductive features 2238A-2238E may adopt method A, while some of the conductive features 2238A-2238E may adopt method B. For example, contact resistances may be more important for conductive features of lower dimensions. Therefore, method B may be implemented for the formation of the conductive features 2238A, while method A may be implemented for the formation of the conductive features 2238B and 2238C in order to achieve a balance between performance and cost. The present disclosure contemplates any combinations of methods A and B.

At this stage, the method 10 determines whether there are additional layers of the interconnect structure 204 to form. If so, the method 10 may return to block 14 and blocks 14-26 are repeated to form subsequent layers. When it is determined that all layers of the interconnect structure have been formed, the workpiece 200 is provided for further fabrication. In various examples, this includes metallization, dicing, packaging, and other fabrication processes. Additional steps can be provided before, during, and after the method 10, and some of the steps described can be replaced or eliminated for other embodiments of the method 10. Moreover, although the disclosure describes a layer-by-layer fabrication method, in some embodiments, conductive features from adjacent interconnect layers may alternatively be fabricated in a unified process, such as a dual damascene process.

As described above, it is beneficial to reduce the resistances within the conductive features. This may be achieved by selecting proper fill materials for the conductive features based on their respective dimensions. According to classic physics, resistivity is a material property that does not change with the physical dimensions of the material. This theory omits the effect of scattering interactions between the charge carriers (such as electrons) and the feature interfaces. Specifically, as charge carriers move along the direction of the conductive features, scattering of the charge carriers inevitable occurs at the material interfaces and grain boundaries. For example, scattering may occur at the sidewalls of a fill metal layer of a conductive feature. Such scatterings deflect the charge carriers from their intended moving direction and cause increase in the resistivity. While such increases are negligible when the feature size (e.g. width dimension) vastly exceeds electron mean free path (MFP), it becomes substantial or even determinative when the feature size approaches the MFP. In that regard, MFP is a material property defined as the average distance travelled in the bulk material by a moving an electron between successive impacts (collisions), that modify its direction or energy or other particle properties. The smaller the MFP is, the greater the scattering effect has on the resistivity. This is the so-called classical resistivity size effect. Therefore, fill materials found to be optimal for bulk dimensions no longer provide the lowest resistances, at low dimensions, such as those increasingly found in advanced technology nodes. Guided selection of fill materials becomes essential to reduce the overall resistivity. Methods disclosed herein classify conductive features based on their dimensions, and assign proper materials based on their classifications.

Referring to method 400 of FIG. 17, the material options for each of the conductive features may be assigned based on their designed dimensions prior to the start of fabrications. For example, referring to block 402 of FIG. 17, an integrated circuit (IC) layout is received. The IC layout depicts all conductive features (such as conductive features 2238A-2238E) to be fabricated, each with specified width dimensions. The IC layout may take any appropriate forms. For example, the IC layout may be similar to that of the FIG. 3, and depicts dimensions for each respective conductive features. The conductive features 2238A-2238E each have a length dimension along the X-direction, a width dimension along the Y-direction, and a height dimension along the Z-dimension. In some embodiments, the width dimension along the Y-direction is the smallest (or narrowest) dimension. Accordingly, the fill materials of the conductive features may be chosen based on the width dimensions along the Y-direction, such as the width 300A-300E of the respective conductive features 2238A-2238E.

Referring to block 404 of FIG. 17, for each conductive features, the width dimension is compared against the first threshold width (T1) and the second threshold width (T2). The first threshold width T1 is less than the second threshold width T2. If the width dimension is less than the first threshold width T1 (see block 406A), such as that of conductive features 2238A having the width 300A, the conductive feature is assigned a LD-type fill material. If the width dimension is greater than the second threshold width T2 (see block 406C), such as that of conductive features 2238C having the width 300C, the conductive feature is assigned a HD-type fill material. And if the width dimension is between the first threshold width T1 and the second threshold width T2 (see block 406B), such as that of conductive features 2238B having the width 300B, the conductive feature is assigned a hybrid structure including both a layer of the LD-type fill material and a layer of the HD-type fill material. HD-type fill material includes aluminum (Al), copper (Cu), aluminum copper (AlCu), copper manganese (CuMn), or combinations thereof. Generally, HD-type fill materials have low resistance at a bulk dimension (such as at dimensions greater than 20 nm). However, HD-type fill materials also typically have relatively large MFP. Accordingly, they may not be suitable for conductive features having a width dimension close to or less than their MFP, as scattering effect may dominate and cause unacceptably large resistivity. LD-type fill material includes ruthenium (Ru), molybdenum (Mo), iridium (Ir), cobalt (Co), nickel (Ni), rhodium (Rh), tungsten (W), or combinations thereof. LD-type fill materials have a relatively small MFP, and therefore is suitable for conductive features of any width dimensions. However, because LD-type fill materials are often more costly than HD-type fill materials, it may be more economic to reserve them specifically for conductive features for which other materials are not suitable. In other words, the assignments of the LD-type fill material are at least partially based on the MFP of the LD-type fill material and the dimensions of the conductive features. For conductive features that have a width dimension between the first threshold width T1 and the second threshold width T2, they may still be affected by the classical resistivity effect, but to a less extent. These conductive features may employ a hybrid structure including both materials, such that balance between cost and performance may be reached. Although in the depicted embodiments, the hybrid structure takes the form of a two-layer structure, with the LD-type material on the outer layer and the HD-type material on the inner layer, this present disclosure contemplates any suitable structures. For example, the HD-type material may alternatively be on the outer layer and the LD-type material may be on the inner layer. Moreover, there may be more than two layers. Furthermore, the two types of materials may be intermixed to form a uniform alloy layer.

The first threshold width T1 and the second threshold width T2 are assigned based on a balance between available material options, their MFP, their respective resistivity at the relevant dimensions, as well as their respective costs. In some embodiments, the first threshold width T1 and the second threshold width T2 are selected based on the MFP of the available fill materials. For example, the first threshold width T1 is selected to be at least greater than the MFPs of the LD-type fill materials. Also, the second threshold T2 is selected to be at least greater than the MFPs of the HD-type fill materials. If the first threshold width T1 is less than the MFPs of the LD-type fill materials, those features assigned with the LD-type fill material may suffer high resistance due to the feature dimensions approaching or being less than the MFP. Although the same effect is less pronounced for HD-type fill materials, it nevertheless may have discernable effects in advanced technology nodes. In some embodiments, the first threshold width T1 and the second threshold width T2 may be measured in the unit of smallest line width (SLW) of the interconnect structure. For example, T1=1 SLW refers to T1 being equal to the line width of narrowest line of the interconnect structure; T1=2 SLW refers to T1 having a value that equals twice the line width of the narrowest line of the interconnect structure; and so on. In some embodiments, T1 is about 1 SLW to about 2 SLW. The second threshold width T2 is similarly measured in the unit of SLW. In some embodiments, T2 is about 4 SLW to about 5 SLW. In some embodiments, the smallest line width is about 5 nm to about 10 nm. Accordingly, T1 is about 5 nm to about 20 nm, and T2 is about 20 nm to about 50 nm. If the first threshold width T1 is set at a value too low, such as less than about 5 nm to about 20 nm, there may be too few material options available. This increases the cost of the fabrication. If the first threshold width T2 is set at a value that is too high, such as greater than about 20 nm to about 50 nm, features that do not necessarily require an LD-type fill material will be assigned the more costly LD-type fill material, thereby also increasing the overall manufacturing cost.

Referring to block 408 of the FIG. 17, after the material options are assigned to each conductive feature, fabrication may proceed to form the conductive features, as well as other device features.

Figure 18A:
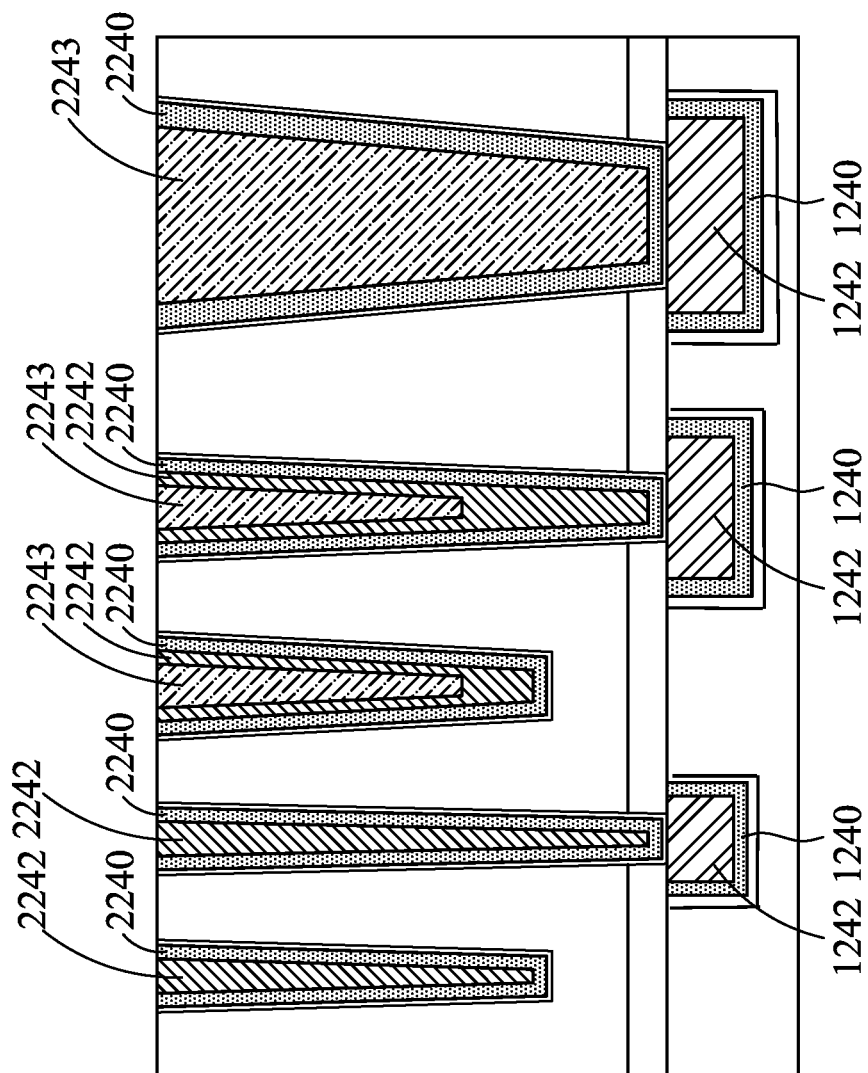
Figure 18B:
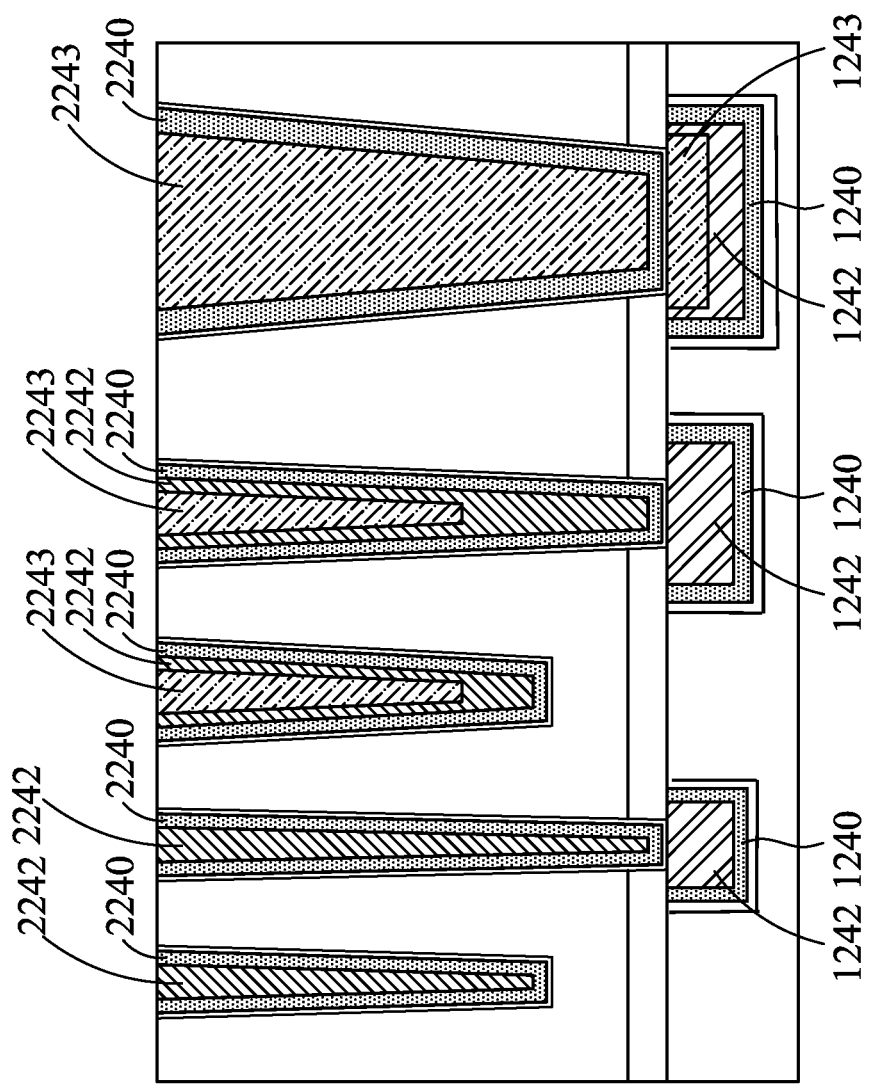
Figure 18C:
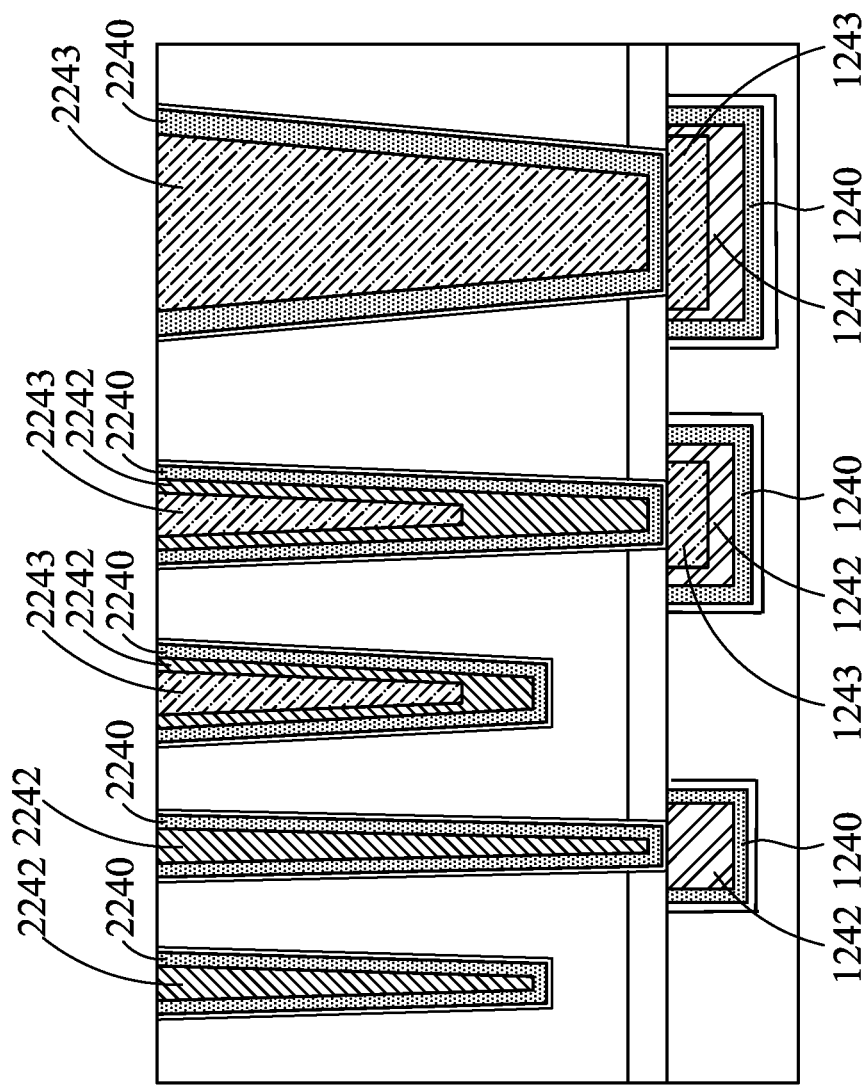
Figure 18D:
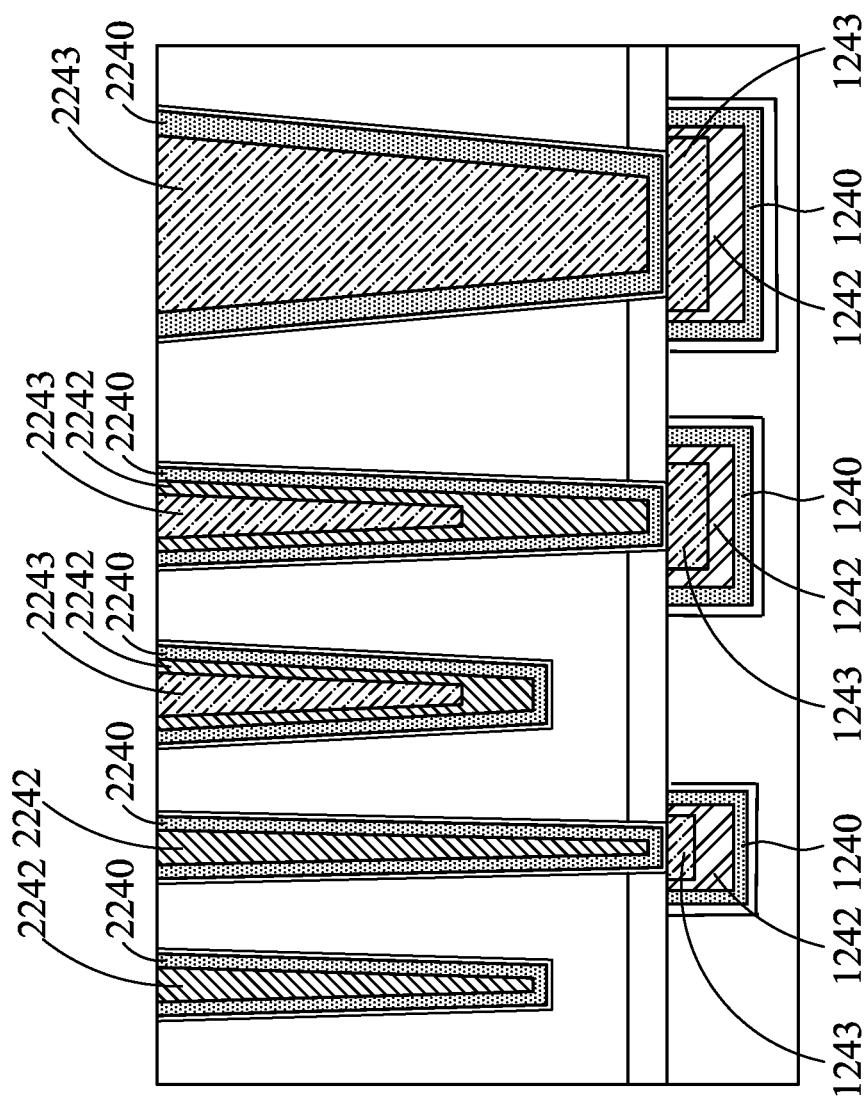
Figure 19A:
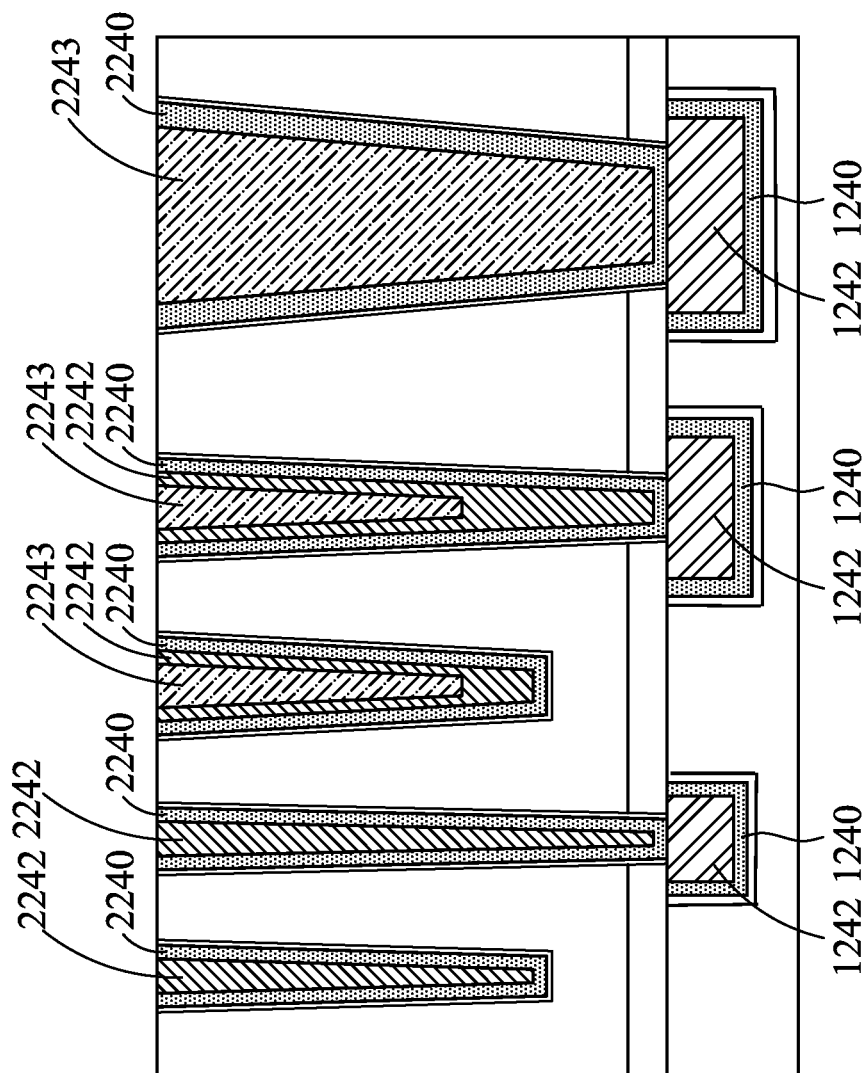
Figure 19B:
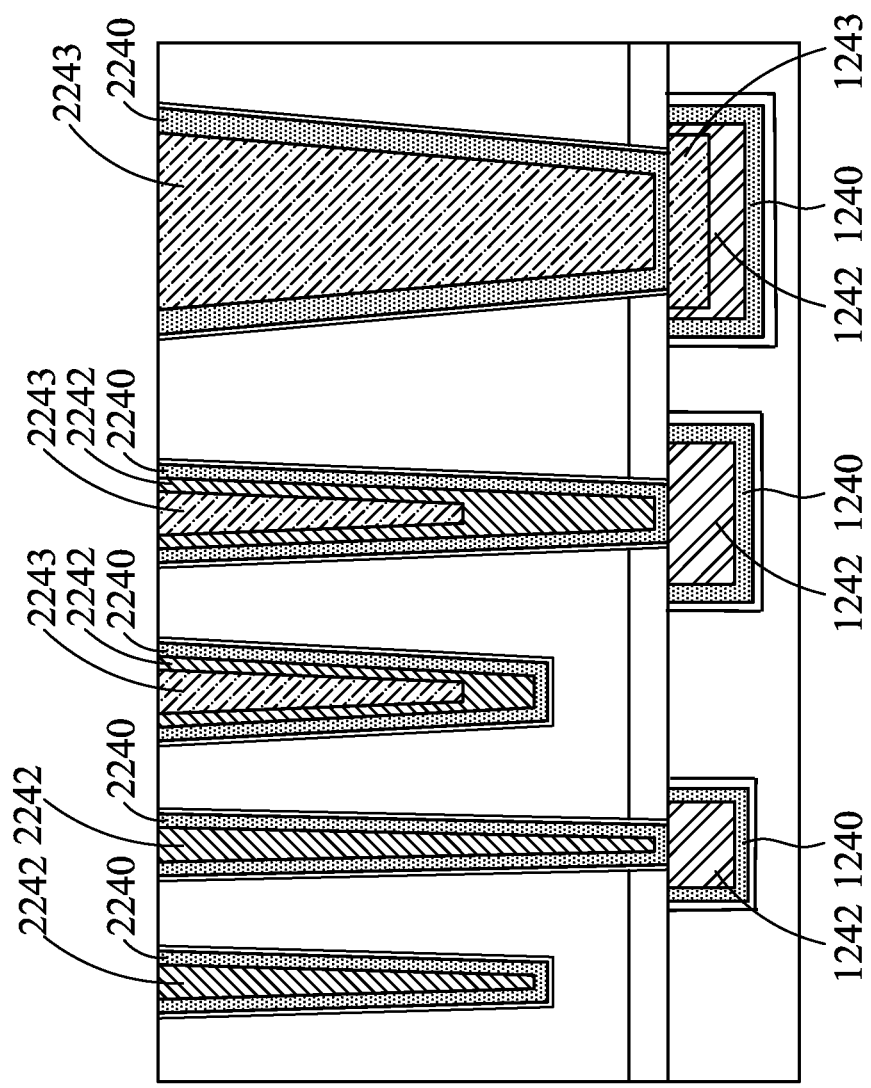
Figure 19C:
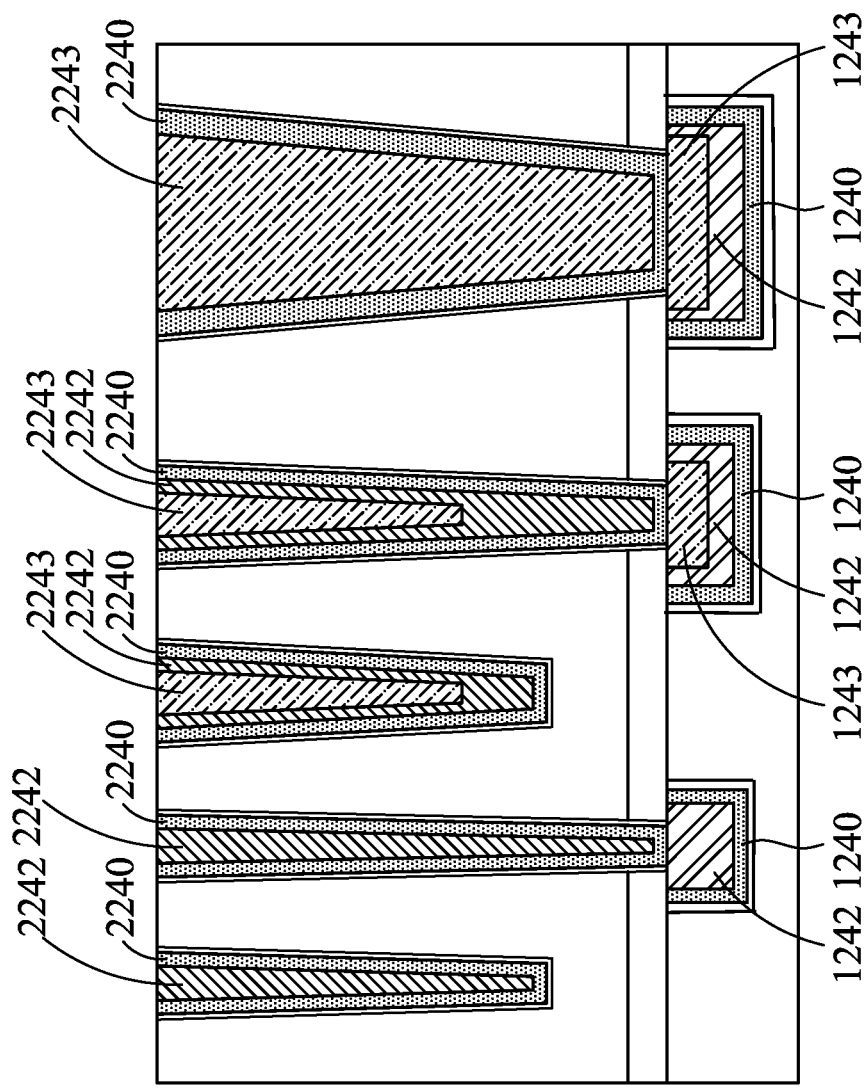
Figure 19D:
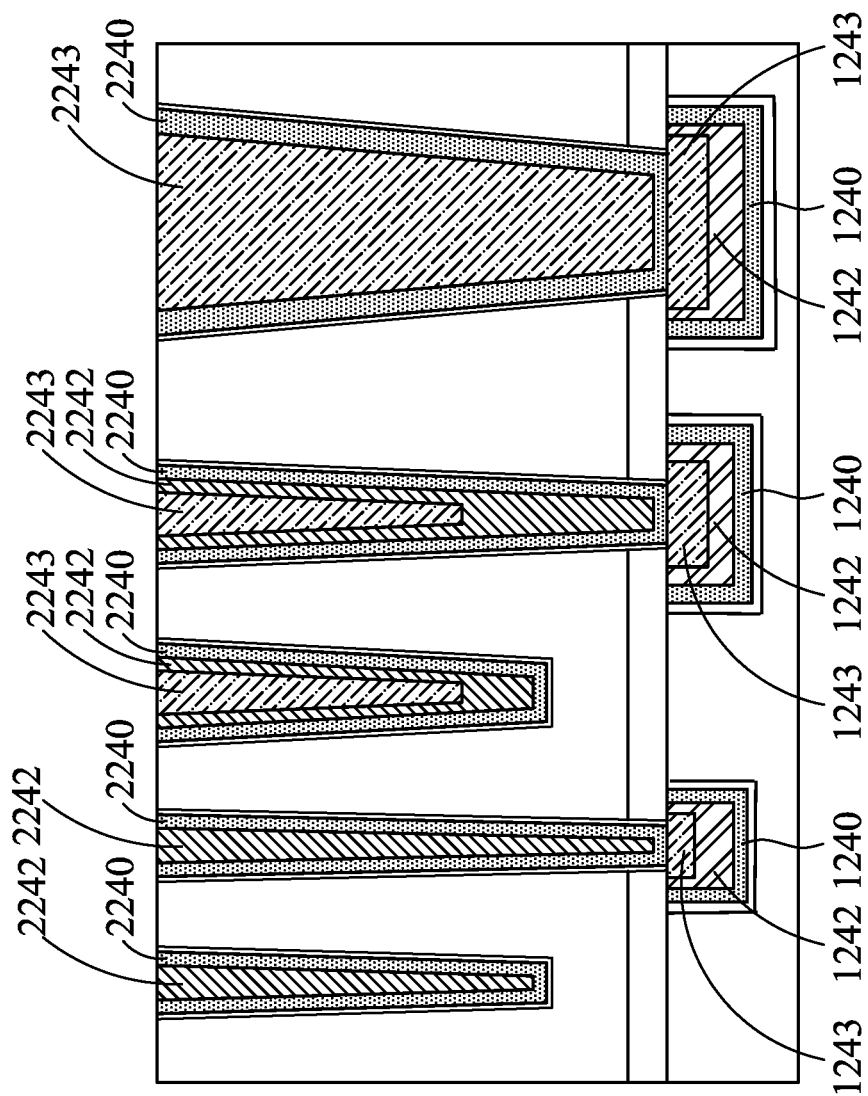

As described above, the interconnect layer 204Y may be overlaid with another interconnect layer 204Z. The formation of the interconnect layer 204Z may implement any suitable methods, such as method A, method B, other suitable methods, or combinations thereof. Similarly, method A, B, or combinations thereof may also be implemented for the formation of interconnect layer 204X. Accordingly, although FIG. 3-16 depict the conductive lines 1238A-1238C as having one uniform and same HD-type fill material, one or more of them may instead include LD-type fill material or a hybrid material structure with both types of fill materials. For example, FIGS. 18A-18D illustrate several scenarios that may be achieved by method A described above. Alternative to the configuration described above with respect to FIG. 10, where underlying conductive lines 1238A-1238C each includes an HD-type fill material, FIG. 18A illustrates that, instead, all conductive lines 1238A-1238C may include an LD-type fill material. FIG. 18B illustrates that the conductive lines 1238A and 1238B may implement the LD-type fill material, while the conductive line 1238C may implement a hybrid structure that includes the LD-type fill material layer 1242 formed on top of the liner layer 1240 and the HD-type fill material layer 1243 formed on top of the LD-type fill material layer 1242. In some embodiments, having the same HD-type fill material on both sides of the liner layer in the trenches 1250C may further improve conductance. FIGS. 18C and 18D illustrate two more scenarios where one or both of conductive lines 1238A and 1238B include similar hybrid fill material structure. Similarly, FIGS. 19A-19D illustrate several scenarios that may be achieved by method B described above. FIGS. 19A-19D substantially resemble FIGS. 18A-18D with the exception that barrier layer 2235 is not present between the conductive features and the corresponding underlying conductive lines.

Based on the above discussions, it can be seen that the embodiments of the present disclosure offer advantages over conventional interconnect structures. It is understood, however, that no particular advantage is required, other embodiments may offer different advantages, and that not all advantages are necessarily disclosed herein. One advantage is the reduction of resistance. As discussed above, in conventional interconnect structures, conductive features of a particular metal layer include the same materials. Because such conductive features may have different dimensions, such uniform feature material composition unnecessarily restricted the use of optimal materials for each conductive feature, and as a result, the resistance cannot be optimized. Here, the disclosed method optimizes the material compositions of each conductive feature based on their dimensions. Accordingly, resistances are minimized, and the performances are improved.

One general aspect of the present disclosure is directed to a method. The method includes receiving an integrated circuit (IC) layout having a plurality of metal features in a metal layer. The method also includes classifying the plurality of metal features into a first type of metal features and a second type of metal features based on a dimensional criterion, where the first type of the metal features have dimensions greater than the second type of the metal features. The method further includes assigning to the first type of metal features a first metal material, and to the second type of metal features a second metal material, where the second metal material is different from the first metal material. The method additionally includes forming the plurality of metal features embedded within a dielectric layer, where each of the plurality of metal features have the respective assigned metal materials.

In some embodiments, the assigning includes assigning based on mean free paths of the first metal materials and the dimensions of the plurality of metal features. In some embodiments, the first metal material has a first mean free path, the second metal material has a second mean free path, and the second mean free path is greater than the first mean free path. Moreover, the first type of metal features have dimensions below a first threshold selected at least partially based on the first mean free path, and the second type of metal features have dimensions greater than a second threshold. In some embodiments, the method further comprises identifying a third type of metal features from the plurality of metal features, where the third type of metal features have dimensions between the first threshold and the second threshold. Additionally, the method further includes assigning to the third type of metal features the first and the second metal materials. In some embodiments, the forming of the plurality of metal features includes the following steps: trenches are formed in the dielectric layer for the plurality of metal features; a sacrificial layer is formed in the trenches for the second type of metal features; the first type of metal features are formed; the sacrificial layer is removed; and the second type of metal features are formed. In some embodiments, the forming of the sacrificial layer includes forming with an azole or an amine, and the removing of the sacrificial layer includes conducting thermal activation or plasma treatment. In some embodiments, the forming of the sacrificial layer includes depositing a benzotriazole, a tolyltriazole, a diphenylamine, or derivatives thereof. In some embodiments, the forming of the plurality of metal features includes: forming a liner layer on and directly contacting a top surface of an underlying conductive feature; and forming one of the plurality of metal features on and directly contacting the liner layer. In some embodiments, the forming of the liner layer includes: forming a trench in the dielectric layer over the underlying conductive feature; forming a passivation layer on a bottom surface of the trench; selectively forming a barrier layer on sidewalls surfaces of the trench; removing the passivation layer; and forming the liner layer on sidewalls of the barrier layer and on the top surface of the underlying conductive feature. In some embodiments, the forming of the plurality of metal features includes forming a metal feature of the first type of metal features over and electrically coupled to the first type of underlying conductive features and forming a metal feature of the second type of metal features over and electrically coupled to the second type of underlying conductive features.

One general aspect of the present disclosure is directed to a method. The method includes receiving a semiconductor structure having a first conductive layer that includes a first conductive feature and a second conductive feature. The method also includes forming an interlevel dielectric (ILD) layer on the first conductive layer; patterning the ILD layer to form a first trench and a second trench such that the first and second conductive features are exposed within the first and second trenches, respectively. Moreover, the method includes forming a blocking feature in the second trench and forming a first metal feature in the first trench and electrically connected to the first conductive feature while the blocking feature is present in the second trench. The blocking feature is then removed, and the method further includes forming a second metal feature in the second trench and electrically connected to the second conductive feature. The first metal feature has a first dimension, the second metal feature has a second dimension, and the second dimension being greater than the first dimension. The first metal feature has a first metal material with a first mean free path, the second metal feature has a second metal material with a second mean free path, and the second mean free path is greater than the first mean free path.

In some embodiments, the method further includes forming a passivation layer over the first conductive feature and over the second conductive feature. The forming of the blocking feature includes forming over the passivation layer. In some embodiments, the method further includes removing the passivation layer over the first conductive feature before the forming of the first metal feature; and removing the blocking feature over the second conductive feature before the forming of the second metal feature. In some embodiments, the method also includes forming a third conductive feature in the first conductive layer. The third metal feature has a third dimension, where the third dimension is greater than the first dimension and less than the second dimension. Moreover, the third metal feature includes the first metal material and the second metal material.

One general aspect of the present disclosure is directed to a semiconductor device. The semiconductor device includes a first underlying metal line and a second underlying metal line in a first dielectric layer over a substrate. The semiconductor device also includes a first metal feature and a second metal feature in a second dielectric layer over the first dielectric layer. The first metal feature is over and connected to the first underlying metal line, and the second metal feature is over and connected to the second underlying metal line. Moreover, the first metal feature has a first dimension, and the second metal feature has a second dimension, where the second dimension is greater than the first dimension. Furthermore, the first metal feature includes a first metal having a first mean free path, and the second metal feature includes a second metal having a second mean free path, where the first dimension is less than the second dimension, and the first mean free path is less than the second mean free path.

In some embodiments, the semiconductor device further includes a third underlying metal line in the first dielectric layer, and a third metal feature in the second dielectric layer. The third metal feature is over and connected to the third underlying metal line. Moreover, the third metal feature has a dimension between the first and the second dimensions, and the third metal feature includes the first metal and the second metal. In some embodiments, the third metal feature includes the second metal between a first portion and a second portion of the first metal and over a third portion of the first metal. In some embodiments, the first dimension is less than 20 nm, and the first metal includes ruthenium, molybdenum, iridium, cobalt, nickel, rhodium, tungsten, or combinations thereof. In some embodiments, the second dimension is greater than about 20 nm, and the second metal includes aluminum, copper, aluminum copper, copper manganese, or combinations thereof. In some embodiments, the second underlying metal line includes the first metal and the second metal.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first underlying metal line and a second underlying metal line in a first dielectric layer over a substrate; and
   a first metal feature and a second metal feature in a second dielectric layer over the first dielectric layer, the first metal feature over and connected to the first underlying metal line, and the second metal feature over and connected to the second underlying metal line,
   wherein the first metal feature has a first dimension, and the second metal feature has a second dimension, the second dimension being greater than the first dimension,
   wherein the first metal feature includes a first metal having a first mean free path, and the second metal feature includes a second metal having a second mean free path, and the second mean free path is greater than the first mean free path.

2. The semiconductor device of claim 1, further comprising a third underlying metal line in the first dielectric layer, and a third metal feature in the second dielectric layer over and connected to the third underlying metal line,
   wherein the third metal feature has a dimension between the first and the second dimensions, and wherein the third metal feature includes the first metal and the second metal.

3. The semiconductor device of claim 2, wherein the third metal feature includes the second metal between a first portion and a second portion of the first metal and over a third portion of the first metal.

4. The semiconductor device of claim 1, wherein the first dimension is less than 20 nm, and wherein the first metal includes ruthenium, molybdenum, iridium, cobalt, nickel, rhodium, tungsten, or combinations thereof.

5. The semiconductor device of claim 4, wherein the second dimension is greater than about 20 nm, and wherein the second metal includes aluminum, copper, aluminum copper, copper manganese, or combinations thereof.

6. The semiconductor device of claim 1, wherein the first and the second underlying metal lines include the second metal without the first metal.

7. The semiconductor device of claim 1, wherein the first and the second underlying metal lines include the first metal without the second metal.

8. The semiconductor device of claim 1, wherein the second underlying metal line includes the first metal and the second metal, and the first underlying metal line includes the second metal without the first metal.

9. The semiconductor device of claim 1, wherein the first and the second underlying metal lines include the first metal and the second metal.

10. The semiconductor device of claim 1, further comprising liner layers in direct contact and surrounding the first and the second metal features, wherein the liner layers include a first and a second liner layer, the first liner layer disposed between the first underlying metal line and the first metal feature, and the second liner layer disposed between the second underlying metal line and the second metal feature.

11. The semiconductor device of claim 10, further comprising barrier layers in direct contact with the first and the second underlying metal lines, wherein the barrier layers include a first and a second barrier layer, the first barrier layer disposed between the first liner layer and the first underlying metal line, and the second barrier layer disposed between the second liner layer and the second underlying metal line.

12. A semiconductor device, comprising:
    first, second, and third underlying metal lines embedded within and separated by a first dielectric layer over a substrate; and
    first, second, and third metal features embedded within and separated by a second dielectric layer over the first dielectric layer, each of the first, second, and third conductive features disposed directly over and electrically connected to the first, second, and third underlying metal lines, respectively,
    wherein the first metal feature has a first dimension and a first fill metal, the second metal feature has a second dimension and a second fill metal, and the third metal feature has a third dimension and a third fill metal,
    wherein the first dimension is greater than the second dimension, and the second dimension is greater than the third dimension,
    wherein the first fill metal has a first mean free path, the second fill metal has a second mean free path, and the third fill metal has a third mean free path, wherein the first mean free path is greater than the second and the third mean free paths.

13. The semiconductor device of claim 12, wherein the first fill metal includes aluminum (Al), copper (Cu), aluminum copper (AlCu), copper manganese (CuMn), or combinations thereof.

14. The semiconductor device of claim 13, wherein the third fill metal includes ruthenium (Ru), molybdenum (Mo), iridium (Ir), cobalt (Co), nickel (Ni), rhodium (Rh), tungsten (W), or combinations thereof.

15. The semiconductor device of claim 12, wherein the first dimension is greater than 20 nm and the third dimension is smaller than 20 nm.

16. The semiconductor device of claim 13, wherein the second fill metal includes a combination of the first and the third metals.

17. The semiconductor device of claim 16, wherein the third fill metal is disposed directly above the second underlying metal line and the first fill metal is disposed directly above the third fill metal.

18. A semiconductor device, comprising:
    first, second, and third underlying metal lines embedded within and separated by a first dielectric layer over a substrate; and first, second, and third metal features embedded within and separated by a second dielectric layer over the first dielectric layer, each of the first, second, and third metal features includes a liner layer and a barrier layer surrounding the respective first, second, and third metal features, wherein the first metal feature is disposed over and connected to the first underlying metal line, the second metal feature is disposed over and connected to the second underlying metal line, and the third metal feature is disposed over and connected to the third underlying metal line wherein the first metal feature has a first dimension, the second metal feature has a second dimension, and the third metal feature has a third dimension, wherein the first metal feature is larger in size and in dimension than each of the first and the second conductive features, wherein the first metal feature includes a first metal having a first mean free path, the second metal feature includes a second metal having a second mean free path, and the third metal feature includes a third metal having a third mean path, wherein the first mean free path is greater than the second and the third mean free paths, wherein the first metal includes copper or aluminum, and the first metal feature is of a different material composition than that of the second and third metal features.

19. The semiconductor device of claim 18, wherein the second metal feature is larger in size than the third metal feature, wherein the second metal feature also includes copper or aluminum.

20. The semiconductor device of claim 19, wherein each of the first, second, and third underlying metal lines is in direct contact with each of the liner layer of the first, second, and third metal features.

* * * * *